United States Patent
Hsu et al.

(10) Patent No.: US 11,373,710 B1
(45) Date of Patent: Jun. 28, 2022

(54) TIME DIVISION PEAK POWER MANAGEMENT FOR NON-VOLATILE STORAGE

(71) Applicant: SanDisk Technologies LLC, Addison, TX (US)

(72) Inventors: Hua-Ling Cynthia Hsu, Fremont, CA (US); Yu-Chung Lien, San Jose, CA (US); Mark Murin, Kfar Saba (IL); Mark Shlick, Ganey-Tikva (IL)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/165,703

(22) Filed: Feb. 2, 2021

(51) Int. Cl.
  *G11C 5/14* (2006.01)
  *G11C 16/30* (2006.01)
  *G11C 16/08* (2006.01)
  *G11C 8/18* (2006.01)
  *G11C 7/22* (2006.01)
  *G11C 11/4076* (2006.01)
  *G11C 16/10* (2006.01)

(52) U.S. Cl.
  CPC .............. *G11C 16/30* (2013.01); *G11C 7/22* (2013.01); *G11C 8/18* (2013.01); *G11C 11/4076* (2013.01); *G11C 16/08* (2013.01); *G11C 16/10* (2013.01)

(58) Field of Classification Search
  CPC ...................................................... G11C 5/141
  USPC ........................................................ 365/229
  See application file for complete search history.

(56) References Cited

U.S. PATENT DOCUMENTS

| | | | |
|---|---|---|---|
| 7,701,764 B2 | 4/2010 | Nguyen | |
| 8,429,436 B2 | 4/2013 | Fillingim et al. | |
| 8,694,719 B2 | 4/2014 | Lassa et al. | |
| 9,329,986 B2 | 5/2016 | Li et al. | |
| 9,443,600 B2 | 9/2016 | Ghalam et al. | |
| 10,013,345 B2 | 7/2018 | Erez et al. | |
| 2014/0112079 A1 | 4/2014 | Wakrat et al. | |
| 2015/0235677 A1* | 8/2015 | Grunzke | G11C 5/04 365/226 |
| 2017/0256955 A1 | 9/2017 | Addepalli et al. | |

* cited by examiner

*Primary Examiner* — Jason Lappas
(74) *Attorney, Agent, or Firm* — Vierra Magen Marcus LLP

(57) ABSTRACT

Time division peak power management in non-volatile memory systems is disclosed. The memory system has a memory controller and a number of semiconductor dies. Each die is assigned a time slot in which to perform high current portions of memory operations. The memory controller provides an external clock to each die. Each die tracks repeating time slots based on the external clock. The memory controller may synchronize this tracking. If a die is about to perform a high current portion of a memory operation, the die checks to determine if its allocated slot has been reached. If not, the die halts the memory operation until its allocated time slot is reached. When the allocated time slot is reached, the halted memory operation is resumed at the high current portion. Therefore, the high current portion of the memory operation occurs during the allocated time slot.

20 Claims, 23 Drawing Sheets

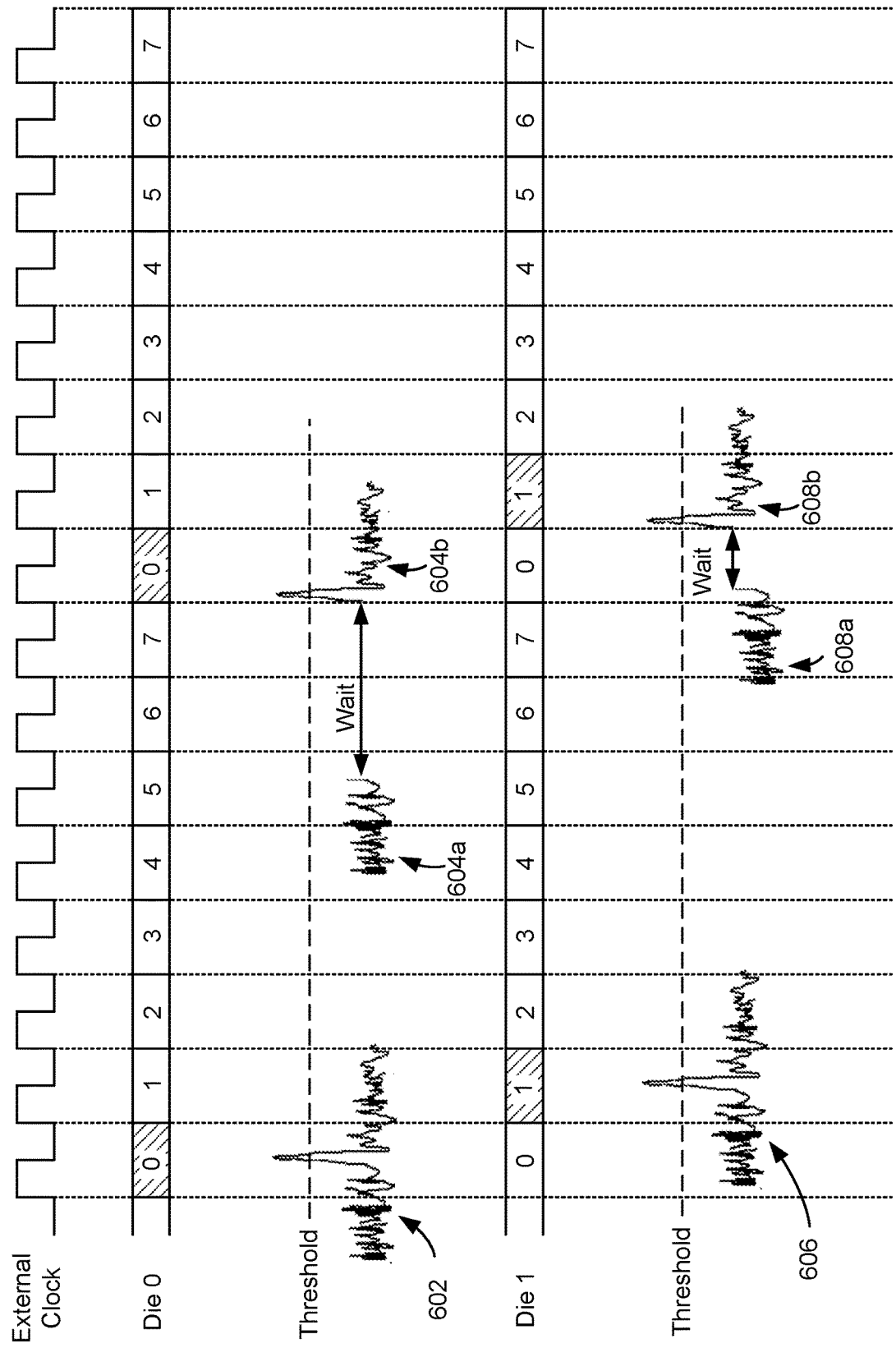

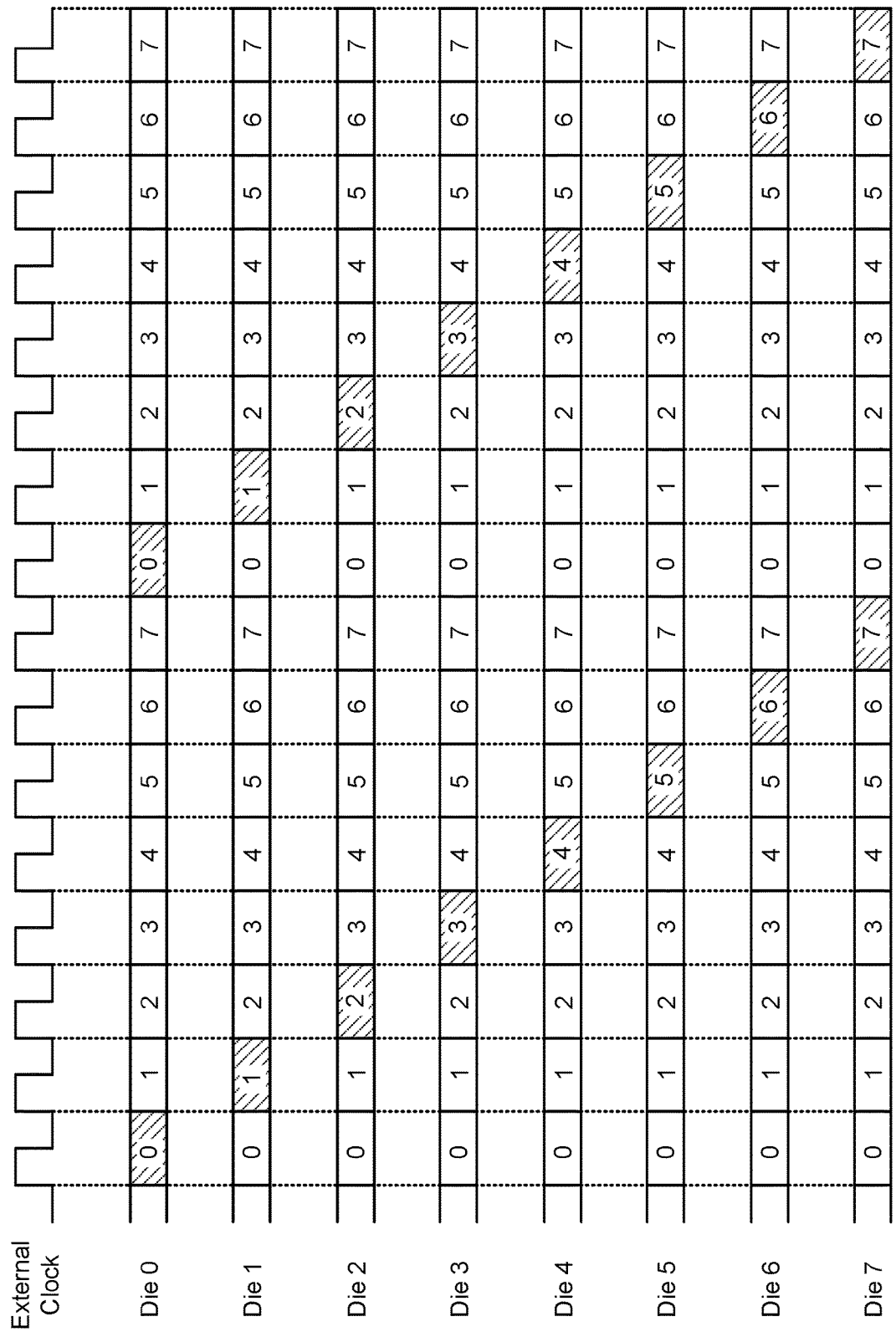

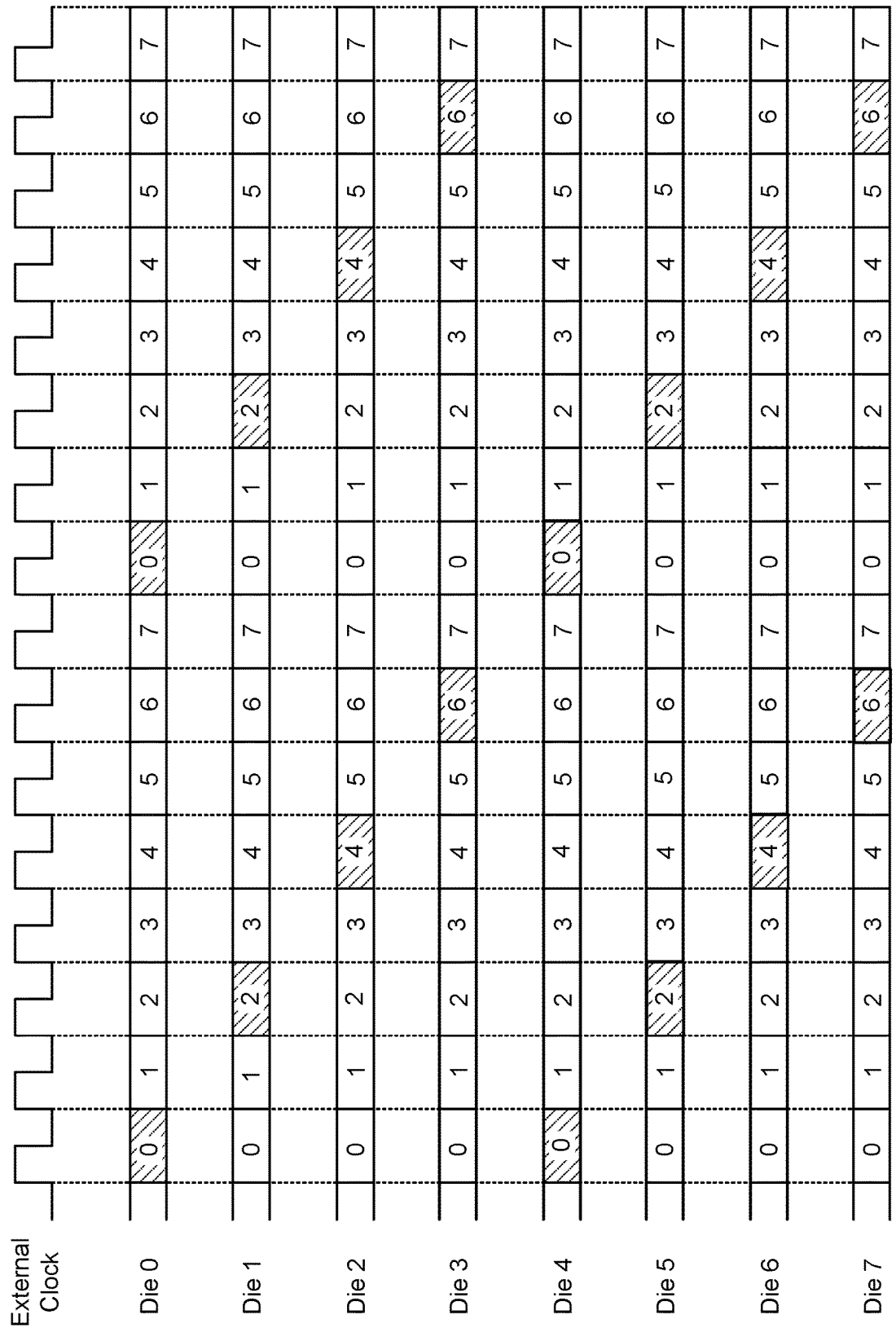

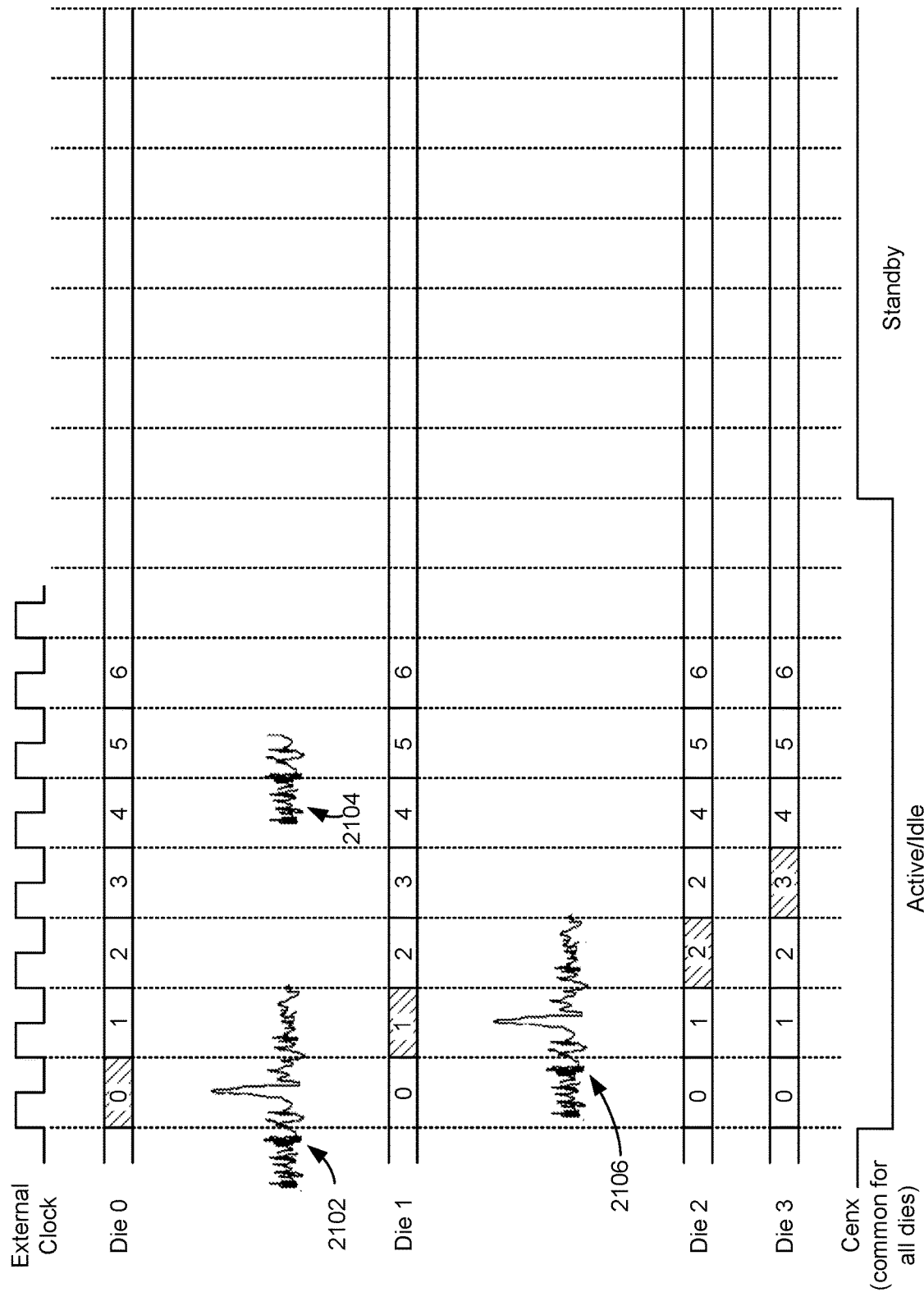

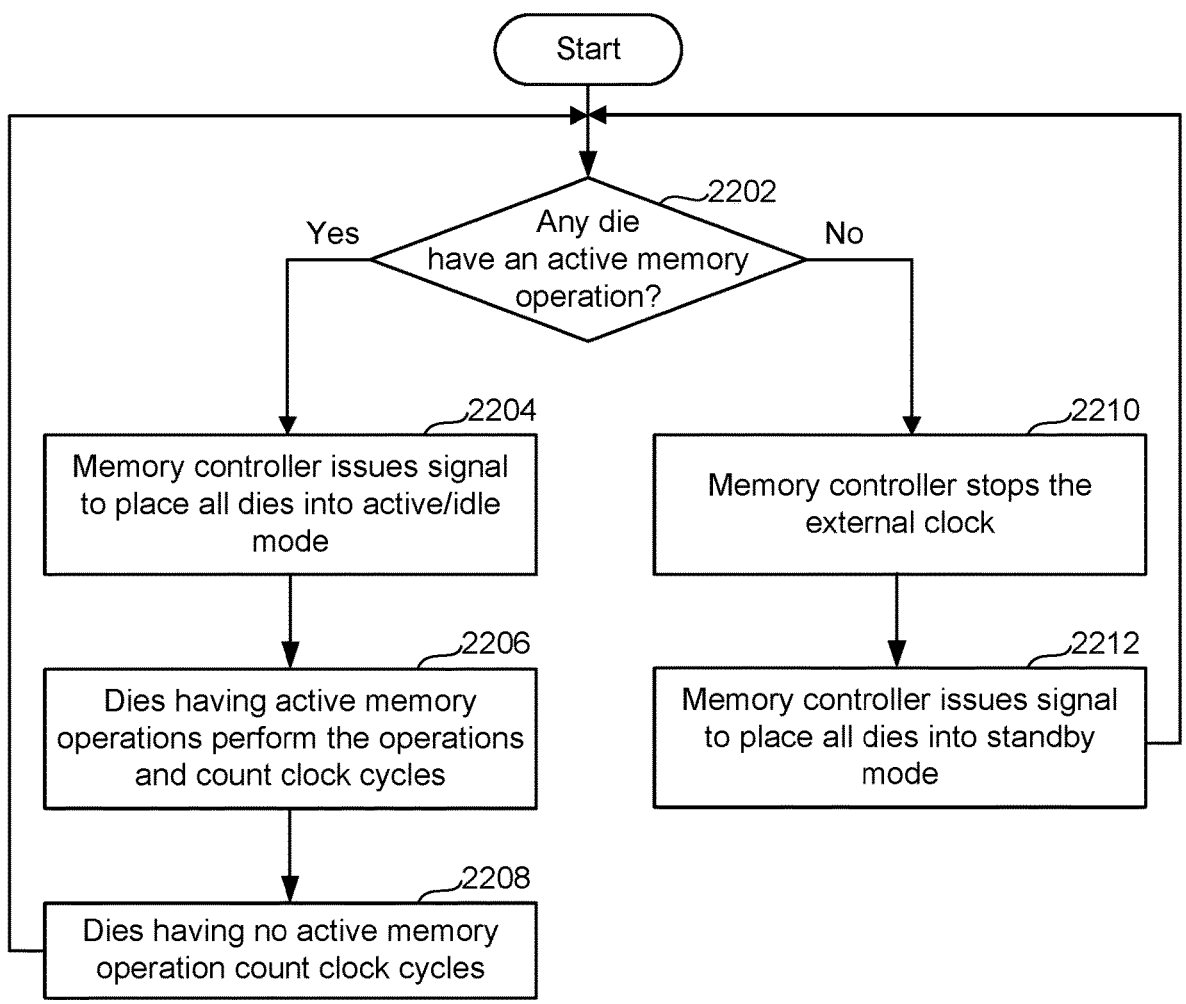

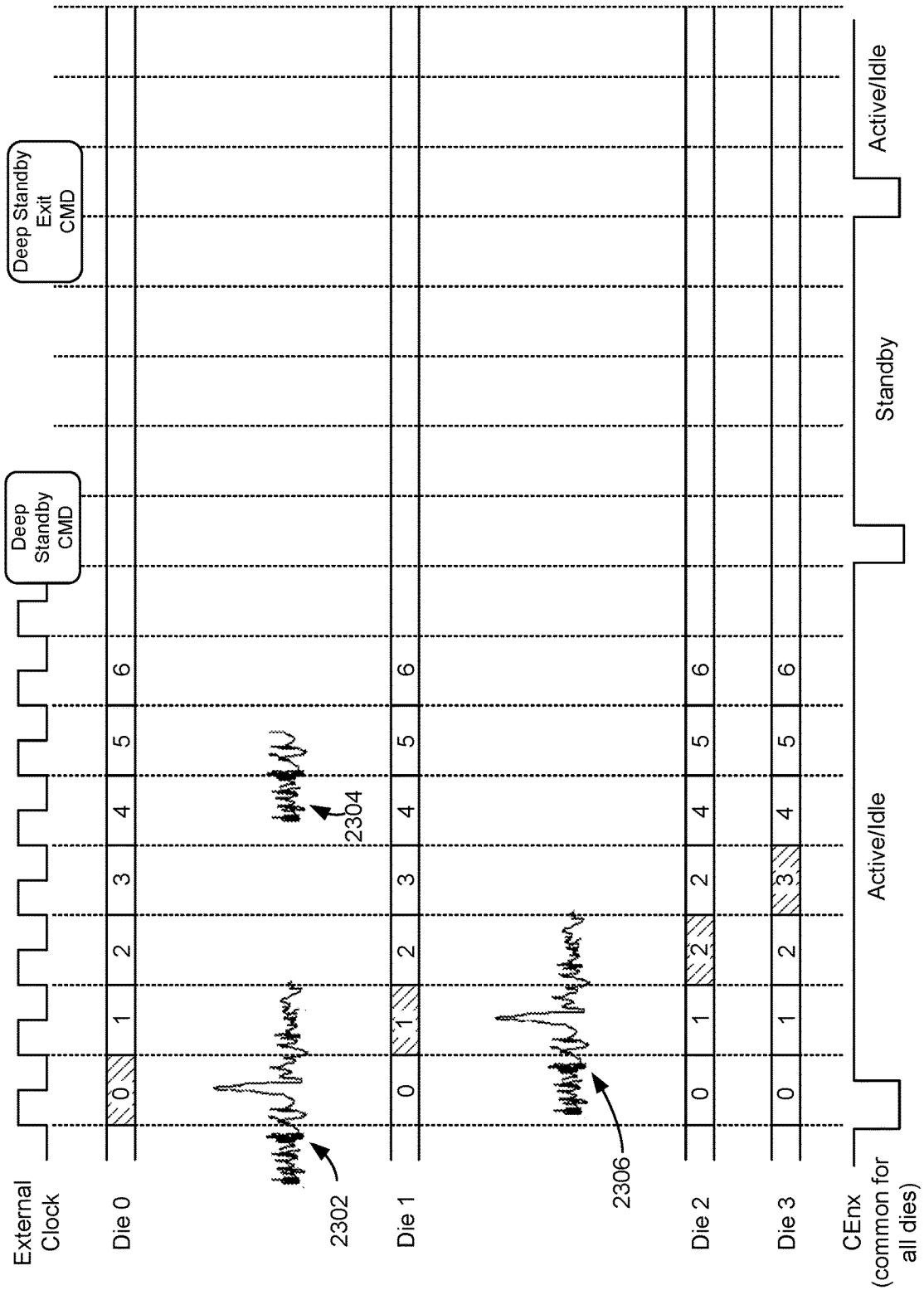

TIME DIVISION PEAK POWER MANAGEMENT FOR NON-VOLATILE STORAGE

BACKGROUND

The strong growth in demand for portable consumer electronic devices is driving the need for high-capacity storage devices. Non-volatile semiconductor memory devices (also referred to herein as "non-volatile memory systems"), such as flash memory storage cards, are widely used to meet the ever-growing demands on digital information storage and exchange. Their portability, versatility and rugged design, along with their high reliability and large capacity, have made such memory devices ideal for use in a wide variety of host electronic devices, including for example digital cameras, digital music players, video game consoles, PDAs, cellular telephones, desktop computers, laptop computers, and notepad computers. Typically, the host electronic devices provides power to the non-volatile memory system.

Non-volatile semiconductor memory systems often contain multiple semiconductor dies ("memory dies") that each contain non-volatile memory cells that may be programmed to store data. It is common to control the memory dies with a memory controller that is separate from the memory dies. The memory dies may be operated by the memory controller in parallel in order to increase performance of the memory system. However, parallel operation is typically limited by the ability of the hosting device to provide power and/or current to the memory system. For example, there may be limits to peak power and/or average power. There are often limits to the peak current that can be provided from the host device to the memory system. The term "peak Icc" is sometimes used to refer to the peak amount of current that is allowed. If the peak current drawn by the memory system is too high, then the magnitude of the supply voltage may drop, which can result in operation failure in the memory system.

Much of the power and/or current that is used by the memory system is used to perform memory operations such as programming, reading, or erasing the memory cells on the memory dies. Hence, the regulation of the power and/or current used by the memory dies is important in order to keep the current of the entire memory system within an allowed amount. Thus, it is common to limit the amount of power and/or current that may be drawn by the memory dies.

One possible technique to control current consumption is for the memory die to stop prior to each program pulse, waiting for the memory controller to issue a go command. The memory die updates it ready/busy status based on whether it is performing an operation or waiting. The memory controller polls the ready/busy status of memory dies and issues go commands accordingly. However, this technique taxes the commination channel between the memory dies and memory controller. Also, system performance can drop due to memory dies waiting for the go command. Moreover, this technique places burdens on the memory controller.

Another possible technique to control current consumption involves use of a ZQ pin. The ZQ pin may be connected to an external resistor to perform ZQ calibration. In ZQ calibration, resistance of output drivers and on-die termination circuits are calibrated. In one technique, each memory die is connected to the ZQ pin. To control current consumption, each memory die estimates current usage for an upcoming memory operation and places a signal having a magnitude representative of the estimated current on the ZQ pin. These signals on the ZQ pin sum together such that the combined signals on the ZQ pin represent an estimate of upcoming current usage for all the memory dies. Each memory die can examine the magnitude of the signal on the ZQ pin. If the magnitude of the signal on the ZQ pin is above a threshold, then a memory die may suspend an upcoming memory operation to stay within a peak current budget. However, this technique has relatively high overhead and complexity.

DESCRIPTION OF THE DRAWINGS

Like-numbered elements refer to common components in the different Figures.

FIG. 6 is a diagram illustrating one embodiment of time division of peak current usage.

FIGS. 7A and 7B depict different ways in which the time slots can be allocated among dies.

FIG. 21 is a diagram illustrating one embodiment in which the memory controller controls modes of operation, and places dies in standby mode.

FIG. 22 is a flowchart of one embodiment of a process of the memory controller controlling modes during TD-PPM.

FIG. 23 is a diagram illustrating another embodiment in which the modes can be controlled such that dies can be placed into the standby mode.

DETAILED DESCRIPTION

Figure 1A:
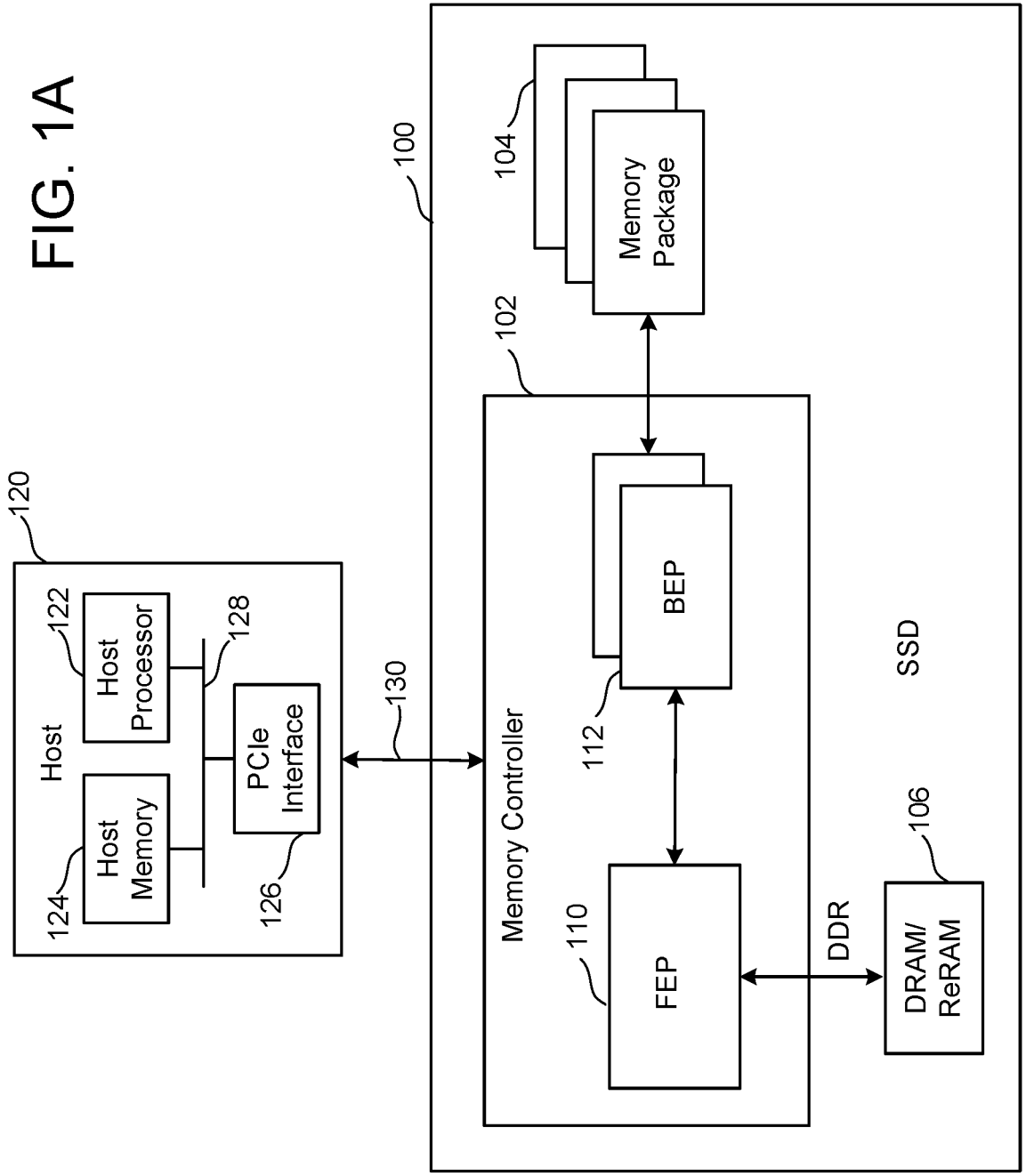
FIG. 1A is a block diagram of one embodiment of a memory system connected to a host.

The present technology will now be described with reference to the figures, which in embodiments, relate to power and/or current management in non-volatile memory systems. In embodiments, the memory system has a memory controller and a number of semiconductor dies. Each semiconductor die (or "die") has a control circuit configured to control memory operations of non-volatile memory cells. The memory cells could be on the same die as the control circuit or on a different semiconductor die. The memory operations have different portions that have different peak currents (or different peak power). The memory controller provides an external clock to each die. Each die tracks a repeating set of time slots based on the external clock. Herein, "a repeating set of time slots" means that there is some unvarying number of time slots in the set, with the set repeating over and over. Each die is allocated one or more of the time slots in each the repeating set in which to perform high current (or high power) portions of memory operations. The current could be a peak current or an average current. Likewise, the power could be a peak power or an average power. Herein, "high peak current" means that the peak current during some time interval is above a threshold. Likewise, "high peak power" means that the peak power during some time interval is above a threshold. Herein, "high average current" means that the average current during some time interval is above a threshold. Herein, "high average power" means that the average power during some time interval is above a threshold. The term "high current" encompasses both high peak current and high average current. The term "high power" encompasses both high peak power and high average power. Herein, examples may discuss either high current usage or high power usage. It will be understood that examples that discuss high current usage also apply to high power usage. Likewise, examples that discuss high power usage also apply to high current usage. Herein, the term time division peak power management (TD-PPM) may be used to refer to power and/or current management in which dies are each allocated a time slot in which to perform high current (or high power) portions of memory operations, as described herein.

The time slots are allocated among the dies in a manner to spread out the current usage. If a die is about to perform a high current portion of a memory operation, the die checks to determine if its allocated slot has been reached. If not, the die halts the memory operation until its allocated time slot is reached. When the allocated time slot is reached, the halted memory operation is resumed at the high current portion. Therefore, the high current portion of the memory operation occurs during the allocated time slot. Moreover, the memory controller is not burdened with tasks such as monitoring a ready/busy status of the dies or sending a go command to the dies in order to manage peak current management. Furthermore, a communication link between the memory controller and the dies is not overloaded with commands, such as a go command issued by the memory controller to instruct a die to go ahead with a memory operation.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation.

FIG. 1A-FIG. 4C describe one example of a memory system that can be used to implement the technology disclosed herein.

FIG. 1A is a block diagram of one embodiment of a memory system 100 connected to a host system 120. Memory system 100 can implement the technology disclosed herein. Many different types of memory systems can be used with the technology disclosed herein. One example memory system is a solid state drive ("SSD"); however, other types of memory systems can also be used. Memory system 100 comprises a memory controller 102, memory package 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit. The term apparatus may be used herein to refer to any of, but not limited to, memory package 104, memory system 100, memory controller 102, or the combination of memory system 100 and host system 120.

In one embodiment, there are a plurality of memory packages 104. Each memory package 104 may contain one or more memory dies. In one embodiment, each memory die in the memory package 104 utilize NAND flash memory (including two dimensional NAND flash memory and/or three dimensional NAND flash memory). In other embodiments, the memory package 104 can include other types of memory; for example, the memory package can include PCM memory.

In one embodiment, memory controller 102 communicates with host system 120 using an interface 130 that implements NVM Express (NVMe) over PCI Express (PCIe). However, the interface 130 is not limited to NVMe or PCIe. For working with memory system 100, host 120 includes a host processor 122, host memory 124, and a PCIe interface 126, which communicate over bus 128. Host memory 124 is the host's physical memory, and can be DRAM, SRAM, non-volatile memory or another type of storage. Host system 120 is external to and separate from memory system 100. In one embodiment, memory system 100 is embedded in host system 120.

Figure 1B:
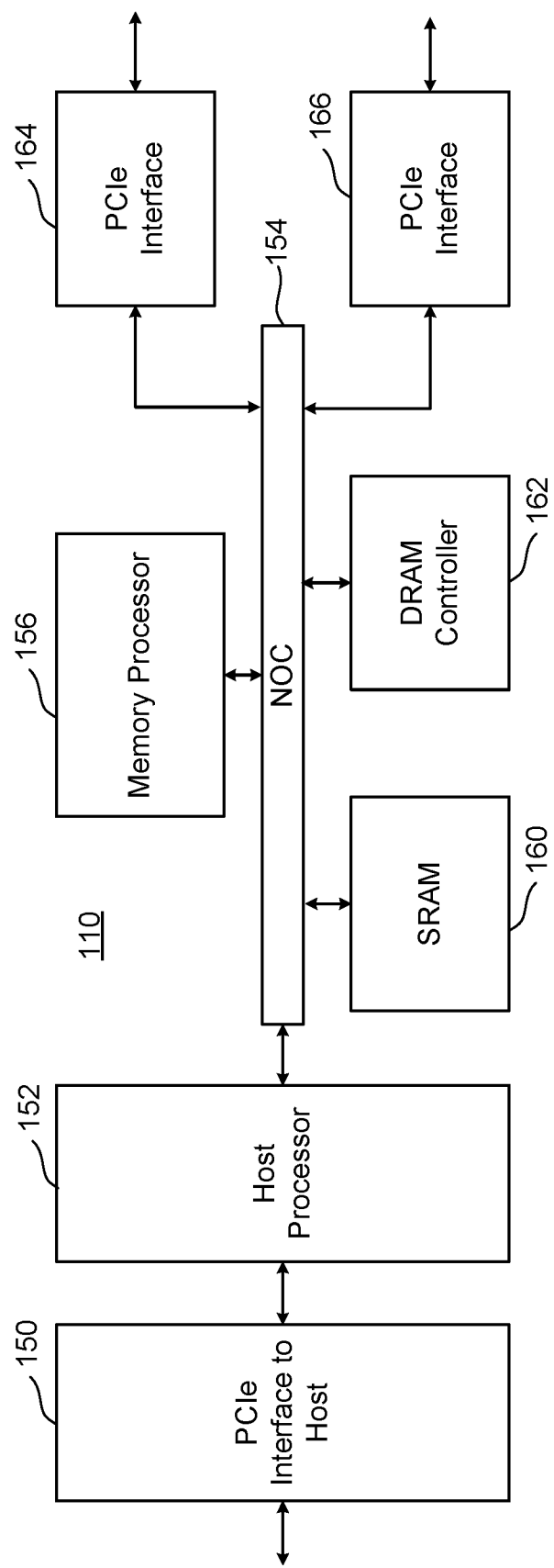
FIG. 1B is a block diagram of one embodiment of a Front End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
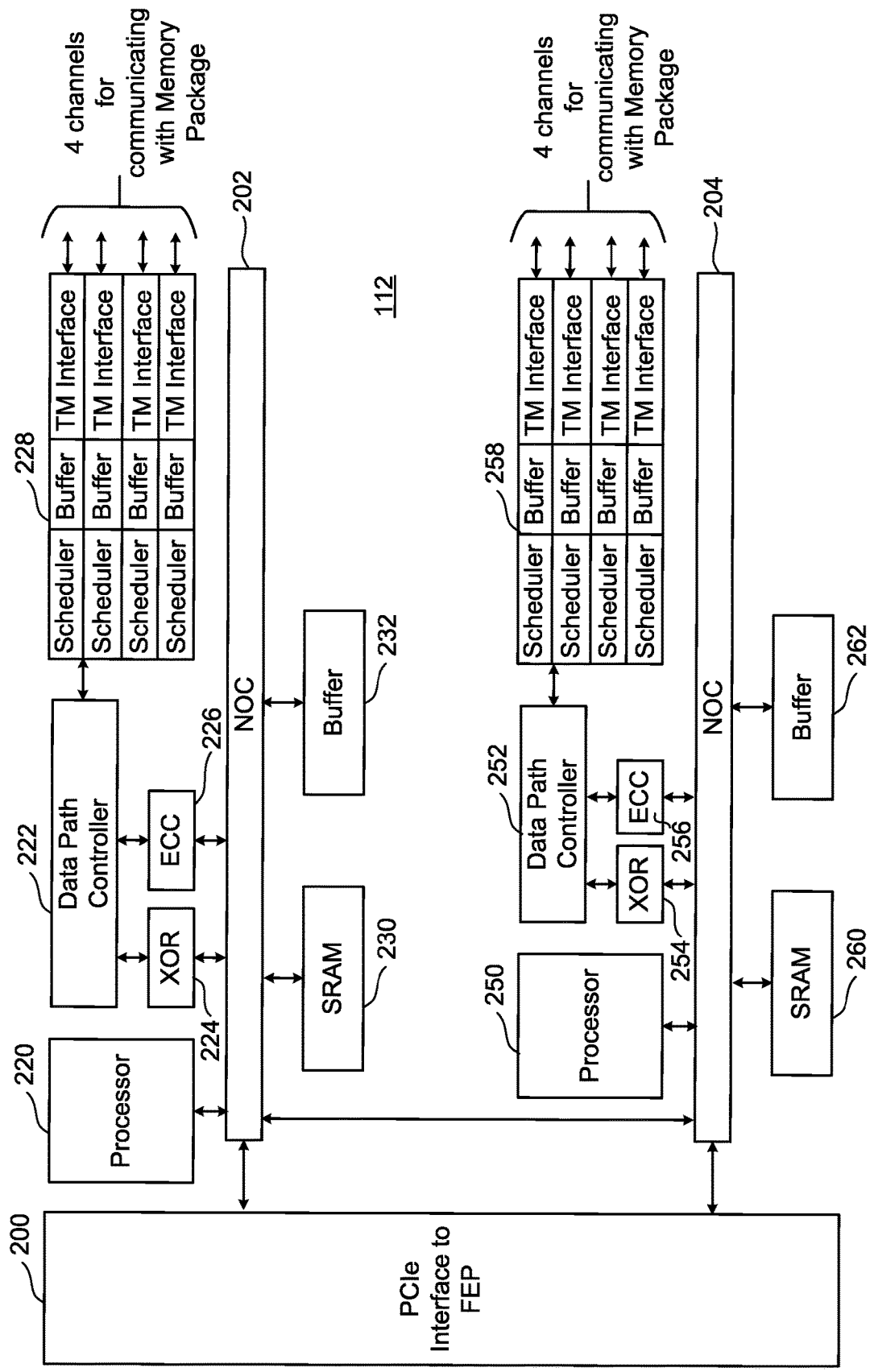
FIG. 2A is a block diagram of one embodiment of a Back End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256), and a read reference voltage calibration engine (225/255). The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error.

Data path controller 222 is connected to a memory interface 228 for communicating via four channels with memory packages. Thus, the top NOC 202 is associated with memory interface 228 for four channels for communicating with memory packages and the bottom NOC 204 is associated with memory interface 258 for four additional channels for communicating with memory packages. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254, ECC engines 226/256, and read reference voltage calibration engines (225/255) are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
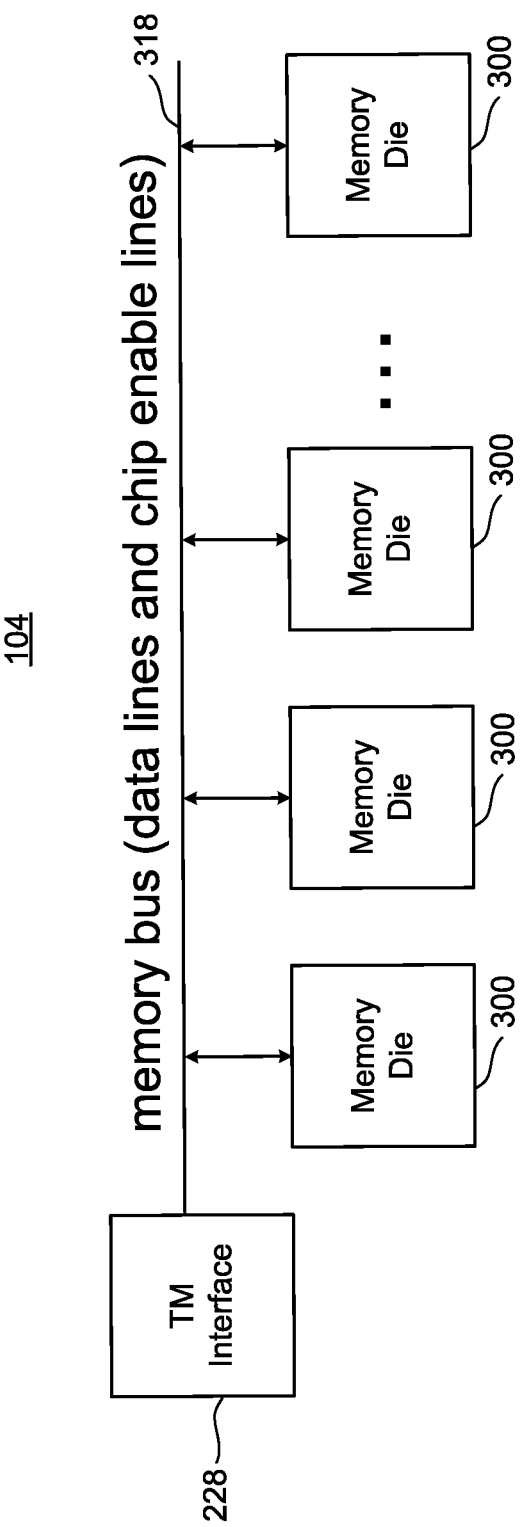
FIG. 2B is a block diagram of one embodiment of a memory package.

FIG. 2B is a block diagram of one embodiment of a memory package 104 that includes a plurality of memory die 300 connected to a memory bus (data lines and chip enable lines) 318. The memory bus 318 connects to a Toggle Mode Interface 228 for communicating with the TM Interface of a BEP circuit 112 (see e.g., FIG. 2A). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

In some embodiments, each memory die 300 in the package 104 is allocated a time slot in which to perform a high current portion (or a high power portion) of a memory operation. The time slots are allocated in a manner to spread out current usage. It is possible to allocate the same time slot to two or more dies 300 and still spread out the current usage. Each memory die 300 tracks the time slots based on a clock provided by the memory controller 102. Therefore, each memory die 300 can determine when to perform the high current portion of a memory operation, without any need of permission from the memory controller 102.

Figure 3A:
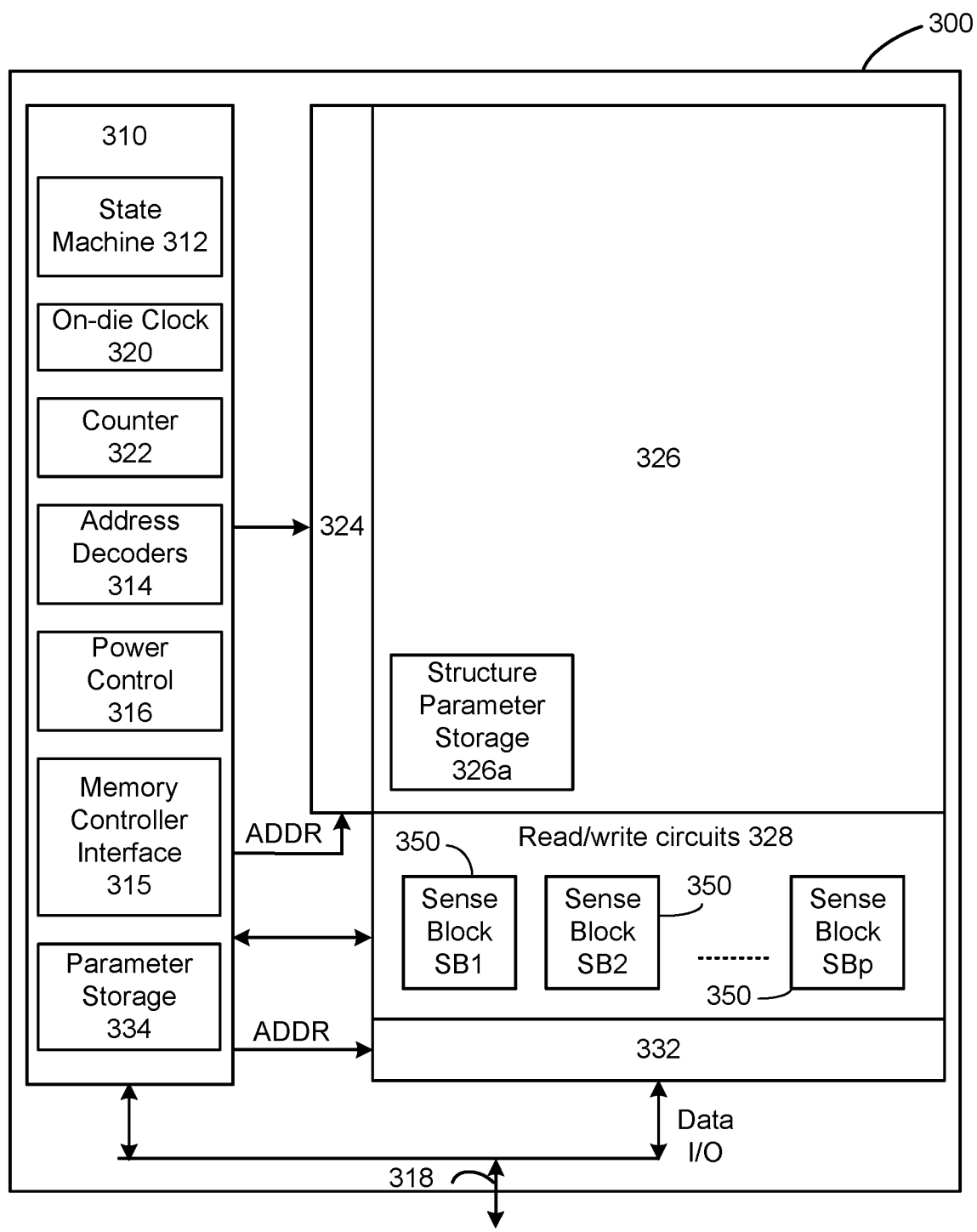
FIG. 3A is a functional block diagram of an embodiment of a memory die.

FIG. 3A is a functional block diagram of one embodiment of a memory die 300. Each of the one or more memory die 300 of FIG. 2B can be implemented as memory die 300 of FIG. 3A. The components depicted in FIG. 3A are electrical circuits. In one embodiment, each memory die 300 includes a memory structure 326, control circuitry 310, read/write circuits 328, and decoders 324/332, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 102 and the memory die 300 via memory controller interface 315. Memory controller interface 315 is an electrical interface for communicating with memory controller 102. Examples of memory controller interface 315 include a Toggle Mode Interface and an Open NAND Flash Interface (ONFI). Other I/O interfaces can also be used. For example, memory controller interface 315 may implement a Toggle Mode Interface that connects to the Toggle Mode interfaces of memory interface 228/258 for memory controller 102. In one embodiment, memory controller interface 315 includes a set of input and/or output (I/O) pins that connect to communication channel 318 (also refers to herein as a data bus). In one embodiment, communication channel 318 connects to the memory controller 102 as part of the Toggle Mode Interface.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control module 316, a memory controller interface 315, an on-die clock 320, a counter 322, and parameter storage 334. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters. The default values and other parameters could be stored in a region of the memory structure 326 (e.g., structure parameter storage 326a).

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

The on-die clock 320 is used to control timing of operations performed by control circuitry 310. For example, the on-die clock 320 may be used by state machine 312 to control timing of applying voltages to the memory structure 326. The on-die clock 320 may be used by state machine 312 to control timing of operations of the read/write circuits 328. Note that the on-die clock 320 may be a different frequency than the clock from memory controller 102. In one embodiment, on-die clock 320 has a considerably higher frequency than the clock from the memory controller 102.

The counter 322 is used to track cycles of an external clock signal provided by the memory controller 102. In an embodiment, the counter 322 is configured to repeatedly count a set of integers from 0 to m−1, where m is an integer greater than 1. For example, the counter may count integers from 0 to 7, and then repeat the count from 0 to 7 over and over. The count may correspond to the time slot. Hence, the set of time slots may run from 0 to m−1, and then repeat over and over. In one embodiment, the counter 322 is reset in response to a synchronization signal from the memory controller 102. The synchronization signal may be used to synchronize the counter 322 in all memory dies 300 in a memory package 104. Hence, each memory die 300 tracks the set of time slots in a synchronized manner. In one embodiment, the state machine 312 determines whether to proceed to a high current portion of a memory operation based on the count.

Parameter storage 334 may be used to store parameters for operating the memory structure 326. Parameter storage 334 may include volatile or non-volatile memory. The memory structure 326 has structure parameter storage 326a which may also contain a copy of the parameters for operating the memory structure 326. In some embodiments, the parameters are copied from structure parameter storage 326a to parameter storage 334 when the memory die 300 is powered on. In one embodiment, one of the parameters specifies a time slot in which the die 300 is permitted to perform a high current portion of a memory operation. For example, the parameter may specify what count (from 0 to m−1) that is allocated to the die 300 for high current usage. In some embodiments, parameter storage 334 contains registers, such as a ready/busy register. The control circuitry 310 may place a value into the ready/busy register, in some embodiments, to indicate ready/busy status of the die 300.

For purposes of this document, control circuitry 310, alone or in combination with read/write circuits 328 and decoders 324/332, comprise one or more control circuits connected to memory structure 326. This one or more control circuits are an electrical circuit that performs the functions described below in the flow charts. In other embodiments, the one or more control circuits can consist only of memory controller 102 (or other controller), which is an electrical circuit in combination with software (e.g., firmware), that performs the functions described below in the flow charts. In another alternative, the one or more control circuits comprises memory controller 102 and control circuitry 310 performing the functions described below in the flow charts. In another embodiment, the one or more control circuits comprises state machine 312 (and/or a microcontroller and/or microprocessor) alone or in combination with memory controller 102. In another alternative, the one or more control circuits comprises memory controller 102, control circuitry 310, read/write circuits 328 and decoders 324/332 performing the functions described below in the flow charts. In other embodiments, the one or more control circuits comprises one or more electrical circuits that operate the non-volatile memory. The term apparatus as used herein may include, but is not limited to, memory die 300, memory package 104, memory system 100, or a host system 120 that includes a memory system 100.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721, 662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3B:
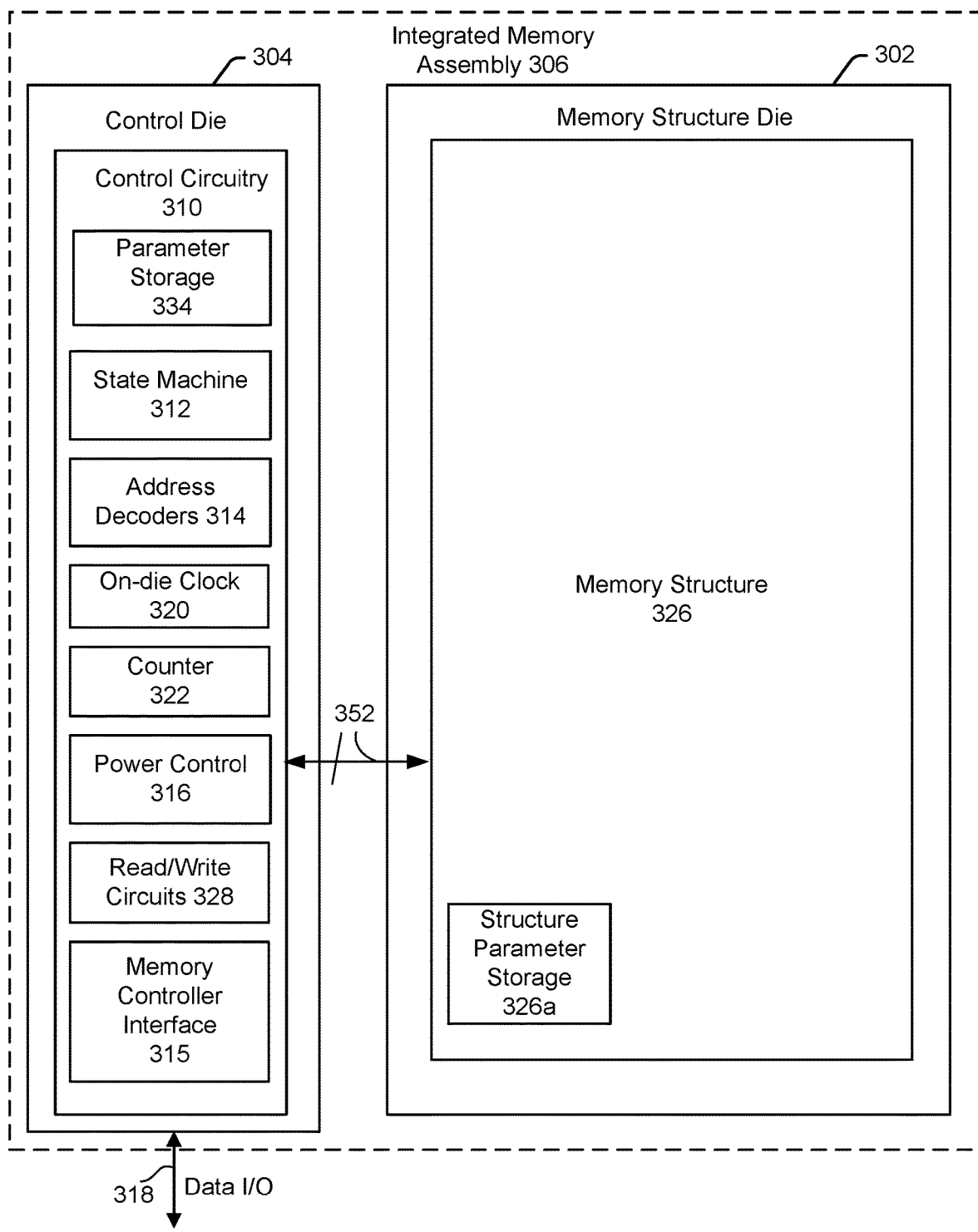
FIG. 3B is a functional block diagram of an embodiment of an integrated memory assembly.

FIG. 3B depicts a functional block diagram of one embodiment of an integrated memory assembly 306. The integrated memory assembly 306 may be used in a memory package 104 in memory system 100. In one embodiment, the integrated memory assembly 306 includes two types of semiconductor die (or more succinctly, "die"). Memory structure die 302 includes include memory structure 326. Memory structure 326 contains non-volatile memory cells. Control die 304 includes control circuitry 310. In some embodiments, the control die 304 is configured to be connected to the memory structure 326. For example, the control circuitry 310 is configured to be connected to non-volatile memory cells in memory structure 326 in memory structure die 302. In some embodiments, the memory structure die 302 and the control die 304 are bonded together. The control circuitry 310 includes state machine 312, an address decoder 314, a power control circuit 316, memory controller interface 315, on-die clock 320, counter 322, and parameter storage 334. The state machine 312, address decoder 314, power control circuit 316, memory controller interface 315, on-die clock 320, counter 322, and parameter storage 334 may operate and be used as described above with respect to memory die 300 in FIG. 3A. The control circuitry 310 also includes read/write circuits 328. In another embodiment, a portion of the read/write circuits 328 are located on control die 304, and a portion of the read/write circuits 328 are located on memory structure die 302.

Any subset of components in the control circuitry 310 of control die 304 can be considered one or more control circuits. In another alternative, the one or more control circuits comprises memory controller 102 and control circuitry 310 of control die 304 performing the functions described below in the flow charts. The one or more control circuits can include hardware only or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), integrated circuit or other type of circuit.

Pathways 352 are pathways between one or more components in the control circuitry 310 and the memory structure on memory structure die 302. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal.

In one embodiment, integrated memory assembly 306 includes a set of input and/or output (I/O) pins that connect to communication channel 318 (also refers to herein as a data bus). In one embodiment, one of the pins is used to receive an external clock signal from the memory controller 102. The clock signal is received by the counter 322, such that the counter may repeatedly count clock cycles from 0 to m−1. Note that the on-die clock 320 may be a different frequency than the clock from memory controller 102. In one embodiment, on-die clock 320 has a considerably higher frequency than the clock from the memory controller 102. Communication channel 318 is depicted as being connected to integrated memory assembly 306 for generality. Communication channel 318 may connect to either or both of die 302 and/or 304. In one embodiment, communication channel 318 connect the memory controller 102 directly to control die 304.

Figure 4A:
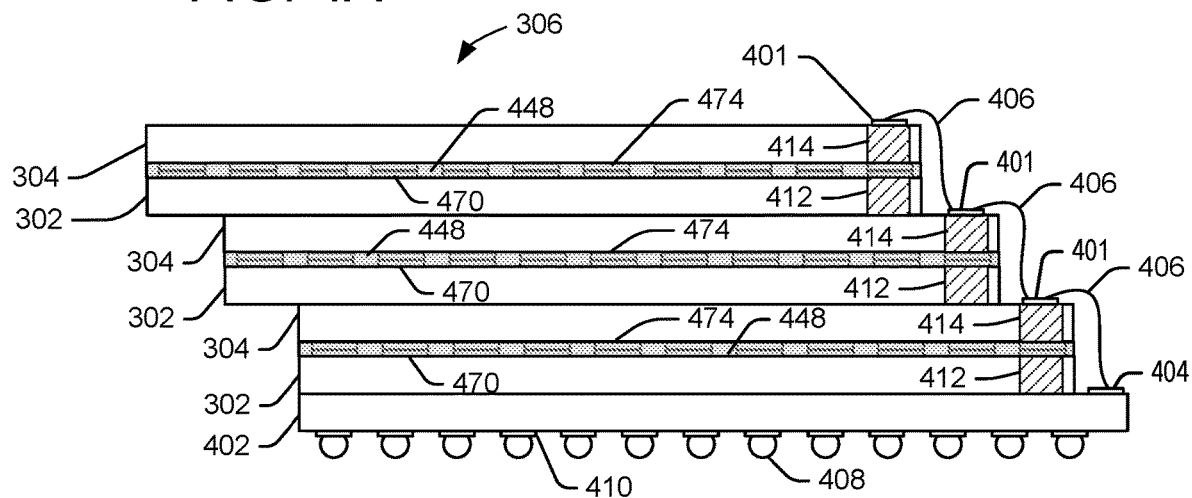
FIG. 4A depicts a side view of an embodiment of an integrated memory assembly stacked on a substrate.

In some embodiments, there is more than one control die 304 and more than one memory structure die 302 in an integrated memory assembly 306. In some embodiments, the integrated memory assembly 306 includes a stack of multiple control dies 304 and multiple memory structure dies 302. FIG. 4A depicts a side view of an embodiment of an integrated memory assembly 306 stacked on a substrate 402 (e.g., a stack comprising control dies 304 and memory structure dies 302). The integrated memory assembly 306 has three control dies 304 and three memory structure dies 302. In some embodiments, there are many more than three memory structure dies 302 and many more than three control dies 304.

Each control die 304 is affixed (e.g., bonded) to at least one of the memory structure die 302. Some of the bond pads 470, 474, are depicted. There may be many more bond pads. A space between two dies 302, 304 that are bonded together is filled with a solid layer 448, which may be formed from epoxy or other resin or polymer. This solid layer 448 protects the electrical connections between the dies 302, 304, and further secures the dies together. Various materials may be used as solid layer 448, but in embodiments, it may be Hysol epoxy resin from Henkel Corp., having offices in California, USA.

The integrated memory assembly 306 may for example be stacked with a stepped offset, leaving ball bumps 401 at each level uncovered and accessible from above. Wire bonds 406 connected to the ball bumps 401 on the control die 304 connect to contact pads 404 on the substrate 402. A number of such wire bonds may be formed across the width of each control die 304 (i.e., into the page of FIG. 4A).

A memory structure die through silicon via (TSV) 412 may be used to route signals through a memory structure die 302. A control die through silicon via (TSV) 414 may be used to route signals through a control die 304. The TSVs 412, 414 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 408 may optionally be affixed to contact pads 410 on a lower surface of substrate 402. The solder balls 408 may be used to electrically and mechanically couple the integrated memory assembly 306 to a host device such as a printed circuit board. Solder balls 408 may be omitted where the integrated memory assembly 306 is to be used as an LGA package. The solder balls 408 may form a part of the interface between the integrated memory assembly 306 and the memory controller 102.

Figure 4B:
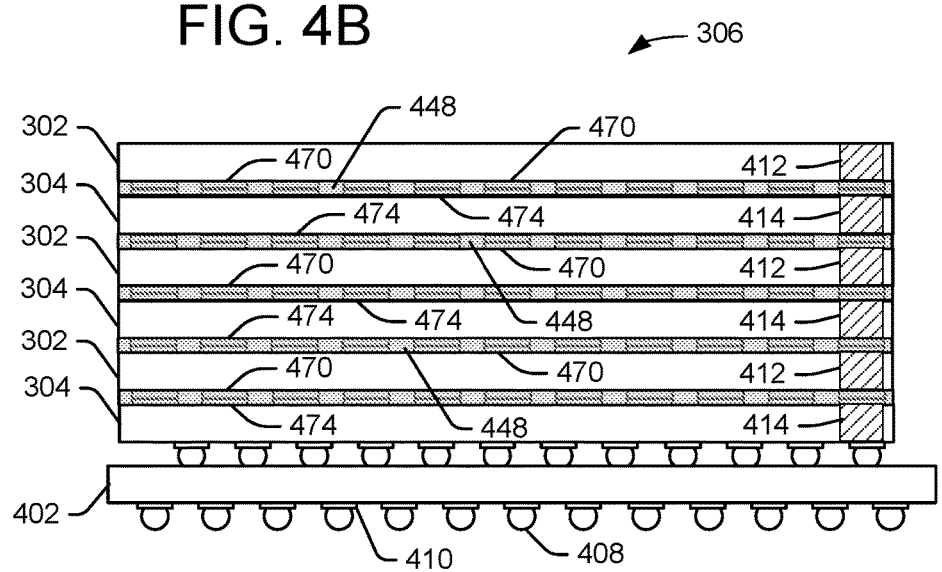
FIG. 4B depicts a side view of an embodiment of an integrated memory assembly stacked on a substrate.

FIG. 4B depicts a side view of an embodiment of an integrated memory assembly 306 stacked on a substrate 402. The integrated memory assembly 306 has three control dies 304 and three memory structure dies 302. In some embodiments, there are many more than three memory structure dies 302 and many more than three control dies 304. In this example, each control die 304 is bonded to at least one memory structure die 302. Optionally, a control die 304 may be bonded to two memory structure dies 302.

Some of the bond pads 470, 474 are depicted. There may be many more bond pads. A space between two dies 302, 304 that are bonded together is filled with a solid layer 448, which may be formed from epoxy or other resin or polymer. In contrast to the example in FIG. 4A, the integrated memory assembly 306 in FIG. 4B does not have a stepped offset. A memory structure die through silicon via (TSV) 412 may be used to route signals through a memory structure die 302. A control die through silicon via (TSV) 414 may be used to route signals through a control die 304.

Solder balls 408 may optionally be affixed to contact pads 410 on a lower surface of substrate 402. The solder balls 408 may be used to electrically and mechanically couple the integrated memory assembly 306 to a host device such as a printed circuit board. Solder balls 408 may be omitted where the integrated memory assembly 306 is to be used as an LGA package.

As has been briefly discussed above, the control die 304 and the memory structure die 302 may be bonded together. Bond pads on each die 302, 304 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 302, 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 4C:
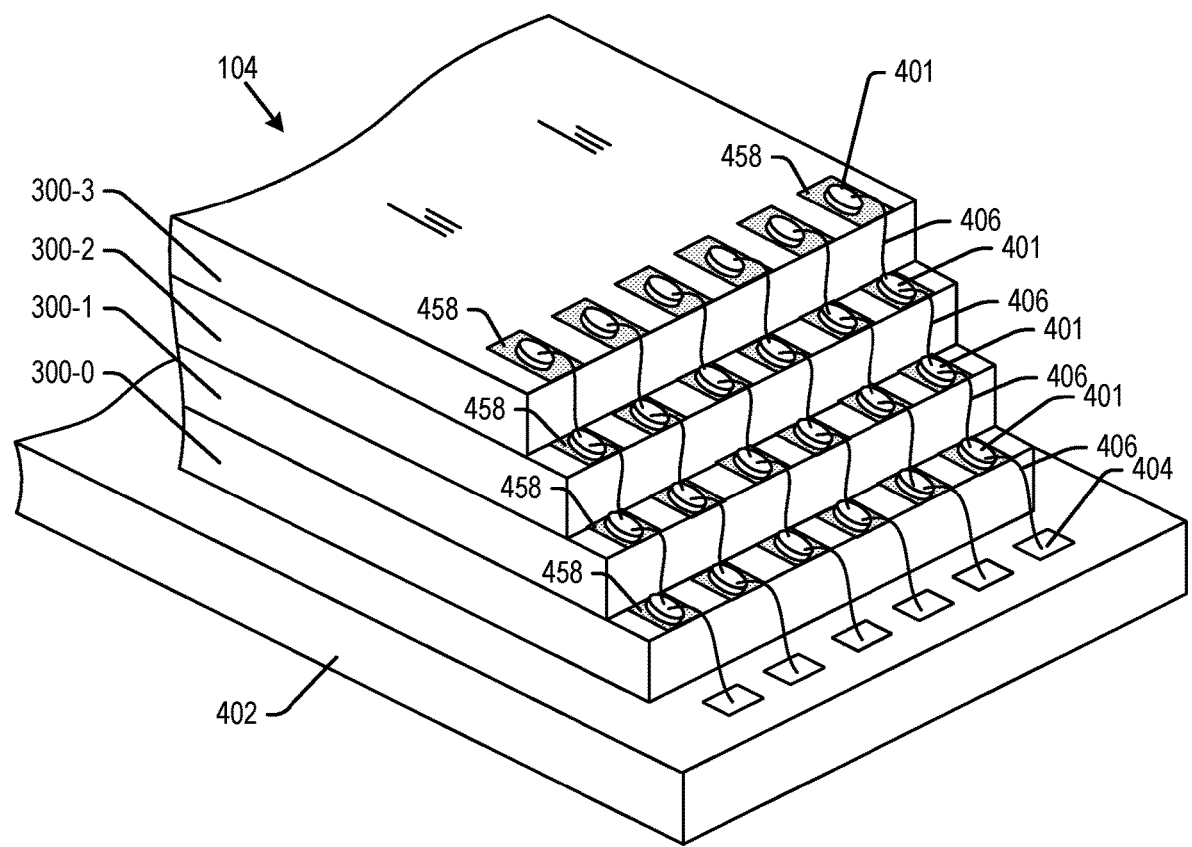
FIG. 4C is a diagram of a memory package having semiconductor dies stacked on top of each other in a stepped offset configuration.

FIG. 4C is a diagram of a memory package 104 having semiconductor dies stacked on top of each other in a stepped offset configuration. Four dies 300-0, 300-1, 300-2 and 300-3 are depicted above substrate 402. Wire bonds 406 connect to ball bumps 401 on each die. The ball bumps 401 connect to contact pads 458 on the respective dies. One of the wire bonds 406 connects the lower die 300-0 to a contact pad 404 on the substrate 402. In some embodiments, the memory controller 102 provides an external clock to one of the contact pads 404 on the substrate 402. Hence, the external clock is provided to each die 300. Note that the external clock may be a different clock than a clock that is used by the memory controller to control data transfer. For example, the die 300 may have a different pin that receives a different clock in the NV-DDR data interface. Details of an NV-DDR data interface with respect to NAND are described in "Open NAND Flash Interface Specification," Revision 4.2, Feb. 12, 2020 (hereinafter ONFI). Note that although FIG. 4C depicts a stack of memory dies 300, each memory die can be replaced with a control die 304 and memory structure die 302, such as in FIG. 4A.

In some embodiments, the contact pad 458 of each die that is used to receive the external clock are bonded together by, for example, wire bonds, as in FIG. 4A. However, it is not required that the contact pads 458 used to receive the external clock are bonded together by wire bonds. There are a limited number of contact pads on each die. Hence, in some embodiments, the contact pad 458 used to receive the external clock during TD-PPM has another function when not in TD-PPM.

In one embodiment, the contact pad 458 used to receive the external clock during TD-PPM is a pad that may be used in a test mode to receive a test clock. The test clock is used by the die to control testing of the memory structure during the test mode. The testing could check for issues such as broken word lines, shorts between word lines, shorts between bit lines, etc. Thus, the contact pad 458 may be used in a test mode to receive a test clock, and also used during an embodiment of TD-PPM to receive the external clock from the memory controller 102.

In one embodiment, the contact pad 458 used to receive the external clock during TD-PPM is a pad that may be used in the test mode to receive test data. Thus, the contact pad 458 may be used in the test mode to receive test data, and also used during an embodiment of TD-PPM to receive the external clock from the memory controller 102.

In one embodiment, the contact pad 458 used to receive the external clock during TD-PPM is a pad that may be used to specify write protect when not in TD-PPM. For example, ONFI defines a write protect pin that may receive a write protect signal that disables program and erase operations. However, the write protect pad is not limited to ONFI. Thus, the contact pad 458 may be used during an embodiment of TD-PPM to receive the external clock and also used to receive a write protect signal when an embodiment of TD-PPM is not being used. In an embodiment, the die response to the write protect signal by disabling program and erase operations.

In one embodiment, the contact pad 458 that is used to receive the external clock during TD-PPM is a read/busy pin. A ready/busy pin may be used to indicate status of the die 300. Details of a ready/busy pin with respect to NAND are described in ONFI. However, the ready/busy pin is not limited to NAND dies. In one embodiment, if the ready/busy pin is used to receive the external clock during TD-PPM, the ready/busy status may be provided during TD-PPM by a ready/busy status register on the die 300. In one embodiment, the die 300 has an input receiver connected to the read/busy pin in order to receive the external clock.

In one embodiment, the contact pad 458 that is used to receive the external clock is a ZQ calibration pad. ZQ calibration may be used to calibrate resistance of output drivers and on-die termination circuits. "Off-chip ZQ calibration" can be performed with the ZQ calibration pad connected to an off-chip calibration resistor. "On-chip ZQ calibration" can be performed by using an on-chip calibration resistor instead of the off-chip calibration resistor. In some embodiments, a ZQ calibration pad is used to receive the external clock during TD-PPM, in which case on-chip ZQ calibration may be used. In one embodiment, the die 300 has a multiplexer to select between the external clock when performing TD-PPM and the on-chip calibration resistor when performing on-chip ZQ calibration. In one embodiment, the die 300 has an input receiver connected to the ZQ calibration pad in order to receive the external clock. Details of ZQ calibration with respect to NAND are described in ONFI. However, ZQ calibration is not limited to NAND dies.

In some embodiments, an extra pad is added to the die 300 in order to receive the external clock during TD-PPM. For example, if the die 300 is a NAND die, the extra pad could be a pad that is not defined in the ONFI. The die 300 may also have an input receiver connected to the extra pad in order to receive the external clock.

Figure 5:
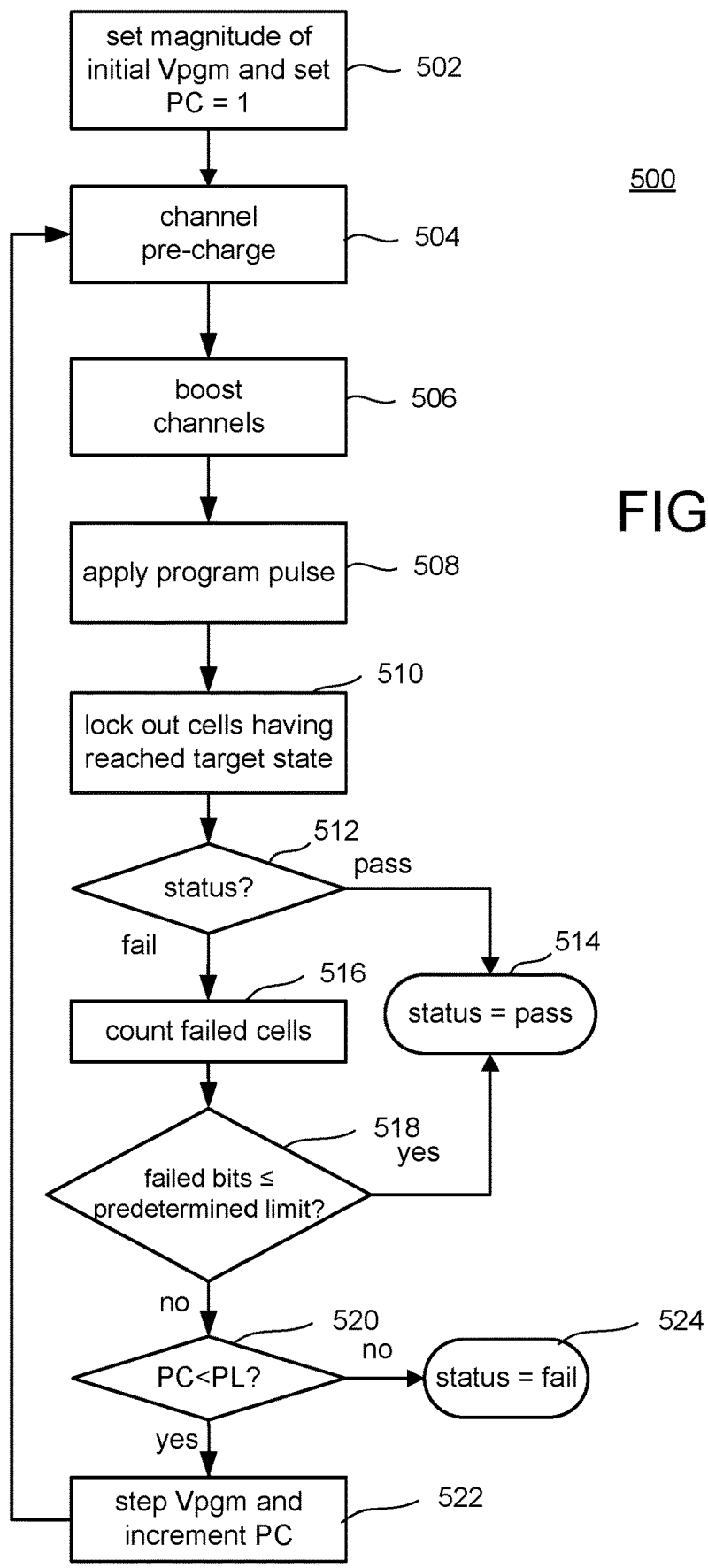
FIG. 5 is a flowchart describing one embodiment of a process for programming NAND strings of memory cells organized into an array.

FIG. 5 is a flowchart describing one embodiment of a process 500 for programming NAND strings of memory cells organized into an array. The process of FIG. 5 can be performed at the direction of state machine 312. In one example embodiment, the process of FIG. 5 is performed on memory die 300 using the control circuitry 310 (and read/write circuits 328, as well as decoders 332/324) discussed above. In one example embodiment, the process of FIG. 5 is performed on integrated memory assembly 306 using the control circuitry 310 discussed above. The process includes multiple loops, each of which includes a program phase (e.g., steps 504-508) and a verify phase (e.g., steps 510-518). The program phase is one example of a memory operation having portions that use different amounts of current. The verify phase is one example of a memory operation having portions that use different amounts of current.

In some embodiments, the control circuitry 310 tracks a repeating set of time slots based on an external clock from the memory controller 102 in order to avoid performing a high current portion of the program phase or the verify phase during a time slot that is not allocated for high current. The process 500 may be halted in the event that a high current portion of the program phase or the verify phase would otherwise occur during a time slot that is not allocated for high current. The point at which process 500 is halted could correspond to the transition from one step to another. However, some of the steps in process 500 could comprises multiple distinct portions that have different current usage. Hence, the halt could occur during one of the steps.

In many implementations, the magnitude of the program pulses is increased with each successive pulse by a predetermined step size. In step 502 of FIG. 5, the programming voltage (Vpgm) is initialized to the starting magnitude (e.g., ~12-16V or another suitable level) and a program counter PC maintained by state machine 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 504 the memory system will pre-charge channels of NAND strings that include memory cells connected to the selected word line that are to be inhibited from programming.

In one embodiment, step 504 is the start of a program operation. In some embodiments, different sets of memory cells are programmed concurrently. For example, programming of memory cells in different memory structures 326 may be performed concurrently.

In step 506, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 508, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string."

In step 508, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 510, memory cells that have reached their target states are locked out from further programming. Step 510 may include performing verifying at one or more verify reference levels. In one embodiment, the verification operation is performed by testing whether the threshold voltages of the memory cells selected for programming have reached the appropriate verify reference voltage.

In step 510, a memory cell may be locked out after the memory cell has been verified (by a test of the Vt) that the memory cell has reached its target state.

If, in step 512, it is determined that all of the memory cells have reached their target threshold voltages (pass), the programming process is complete and successful because all selected memory cells were programmed and verified to their target states. A status of "PASS" is reported in step 514. Otherwise if, in step 512, it is determined that not all of the memory cells have reached their target threshold voltages (fail), then the programming process continues to step 516.

In step 516, the memory system counts the number of memory cells that have not yet reached their respective target threshold voltage distribution. That is, the system counts the number of memory cells that have, so far, failed to reach their target state. This counting can be done by the state machine 312, the memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 518, it is determined whether the count from step 516 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 514. In this situation, enough memory cells programmed correctly such that the few remaining memory cells that have not been completely programmed can be corrected using ECC during the read process. In some embodiments, the predetermined limit used in step 518 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 520 and the program counter PC is checked against the program limit value (PL). Examples of program limit values include 1, 12, 16, 19 and 30; however, other values can be used. If the program counter PC is not less than the program limit value PL, then the program process is considered to have failed and a status of FAIL is reported in step 524. If the program counter PC is less than the program limit value PL, then the process continues at step 522 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 522, the process loops back to step 504 and another program pulse is applied to the selected word line so that another iteration (steps 504-522) of the programming process of FIG. 5 is performed.

FIG. 6 is a diagram illustrating one embodiment of time division of peak current usage. The external clock is provided by the memory controller 102 to each die. Two die (Die 0, Die 1) are represented in FIG. 6. In one embodiment, each die is a memory die 300. In one embodiment, each die is a control die 304. Each die is counting the clock cycles, which are cycle 0 to cycle 7 in this example. Each clock cycle corresponds to a time slot in this example. However, it is possible for the time slots to correspond to a unit of time other than a clock cycle.

Die 0 has been allocated time slot 0 to perform a high peak current portion of a memory operation, as represented by the cross-hatching. Die 1 has been allocated time slot 1 to perform a high peak current portion of a memory operation, as represented by the cross-hatching. Typically, there will be more than two die for which peak current is being managed as a group. For example, there could be eight die in a package 104 with each die being assigned one of the eight time slots. The time slots are not required to be assigned on such a one time slot each for one die basis.

FIG. 6 shows several current profiles 602, 604*a*, 604*b*, 606, 608*a*, 608*b*. These current profiles indicate the current used when executing a memory operation or portion thereof. In one embodiment, this is the current used by the memory die 300. In one embodiment, this is the current used by the memory structure die 302. In one embodiment, this is the current used by the combination of a memory structure die 302 and the control die 304 that controls the memory operation in the memory structure die 302. The dashed lines labeled "Threshold" represents a threshold that defines whether current usage is above or below a "high current." Current profiles 602, 604b, 606, and 608b each have a portion that is above the threshold.

Current profiles 602 and 606 represent current profiles for complete memory operations such as a program, a verify, a read, or an erase. Here, a complete program operation refers to the program phase of a program/verify loop. For example, this refers to steps 504-508 in FIG. 5. Die 0 executed the memory operation having current profile 602 such that the high current portion occurred during the time slot allocated to die 0. Die 1 executed the memory operation having current profile 606 such that the high current portion occurred during the time slot allocated to die 1. Each of these memory operations was able to proceed without waiting for the allocated time slot.

Current profiles 604a and 604b together represent the current used by a memory operation such as a program, a verify, a read, or an erase. The memory operation was started during time slot 4, as indicated by current profile 604a. However, die 0 determined that if the memory operation were not halted, then the high current portion would have occurred in time slot 5, which is not allocated to die 0 for high current. Hence, die 0 halts the memory operation, as represented by the double sided arrow labeled "Wait." Die 0 resumes the memory operation in the next available time slot 0, such that the high current portion occurs during the time slot allocated to die 0 for high current.

Current profiles 608a and 608b together represent the current used by a memory operation such as a program, a verify, a read, or an erase. The memory operation was started during time slot 6, as indicated by current profile 608a. However, die 1 determined that if the memory operation were not halted, then the high current portion would have occurred in time slot 0, which is not allocated to die 1 for high current. Hence, die 1 halts the memory operation, as represented by the double sided arrow labeled "Wait." Die 1 resumes the memory operation in the next available time slot 1, such that the high current portion occurs during that time slot allocated to die 1 for high current.

FIGS. 7A and 7B depict different ways in which the time slots can be allocated among dies. FIG. 7A shows an example in which each of eight die are allocated a different time slot, as represented by the cross-hatched boxes. FIG. 7B shows an example in which only the even time slots are allocated for high current usage. Memory dies are permitted to perform memory operations during the odd numbered time slots, as long as the current usage is not above a threshold.

Figure 8:
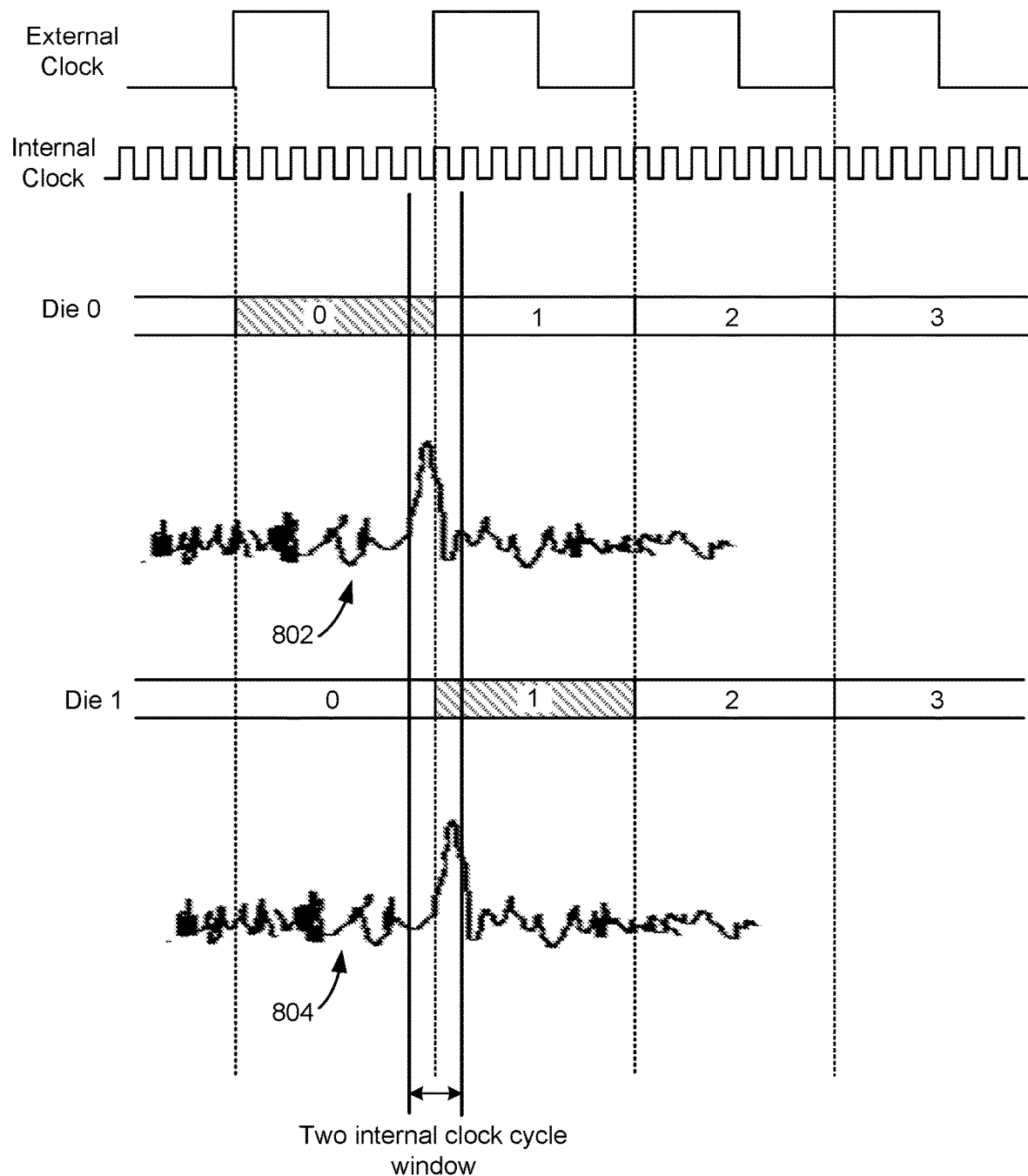
FIG. 8 depicts a possible situation in which two dies could perform a high current portion of a memory operation within a narrow window of time.

FIG. 8 depicts a possible situation in which two dies could perform a high current portion of a memory operation within a narrow window of time. The diagram is consistent with the allocation of time slots in FIG. 7A. The external clock from the memory controller 102 is depicted, as well as an internal clock of the dies. Each die has its own internal clock, which may be provided by on-die clock 320. In this example, the internal clock has a significantly higher frequency than the external clock. In one embodiment, each die is able to start a portion of a memory operation on a cycle of the internal clock. The high current portion of the memory operation of die 0 occurs at the end of time slot 0, which is permissible. The high current portion of the memory operation of die 1 occurs at the beginning of time slot 1, which is also permissible. Thus, the high current portions of the respective memory operations occur within a two internal clock cycle window.

In some embodiments, a slot allocation scheme such as depicted in FIG. 7B is used to avoid such narrow windows in which multiple high current portions of different memory operations could potentially be performed. With reference again to FIG. 7B, the "odd" time slots are not allocated to any die for high current usage. All dies may, however, perform portions of memory operations having current usage below the threshold during either odd or even time slots.

The slot allocation scheme may impact performance issues such as programming time. In some embodiments, trade-offs are made between current usage and performance (e.g., programming time) by suitable selection of the slot allocation scheme, as well as the external clock frequency.

Figures 9, 10:
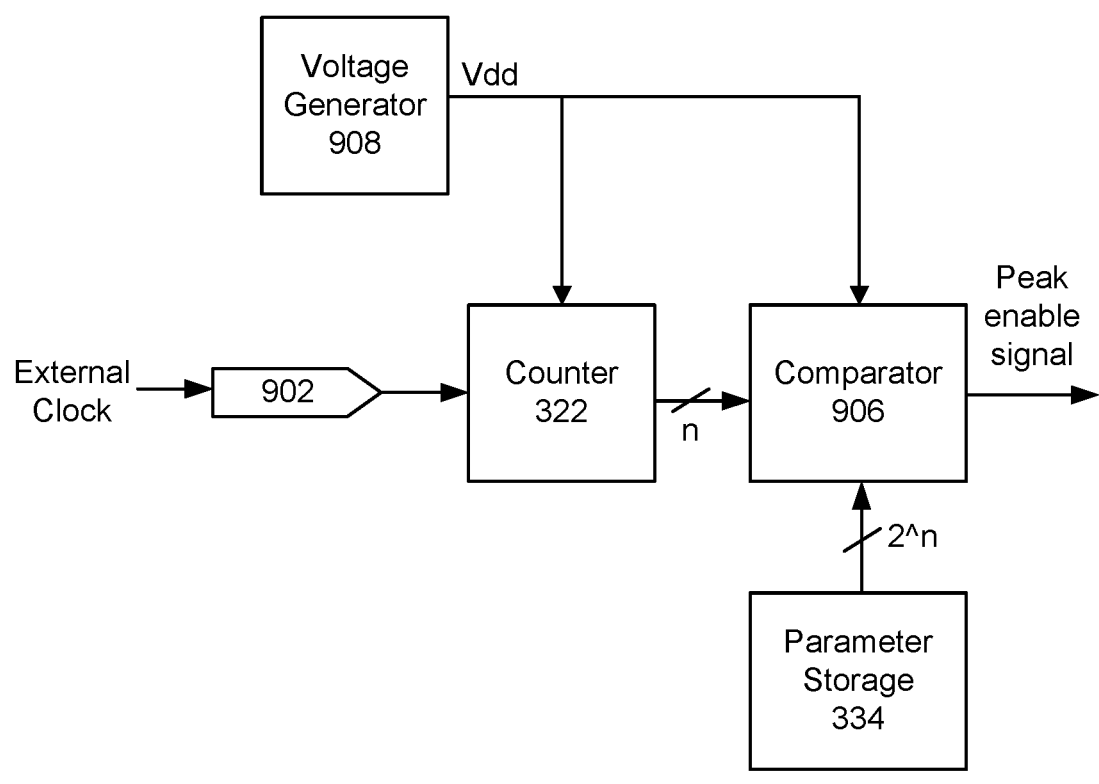
FIG. 9 depicts one embodiment of components on a die that track that time slots and determine whether the allocated time slot for a die is occurring.
FIG. 10 depicts a table showing one example of a format for the code stored by parameter storage.

FIG. 9 depicts one embodiment of components on a die (e.g., memory die 300, control die 304) that track the repeating set of time slots and determines whether the allocated time slot for a die is occurring. The external clock from the memory controller 102 is received an external electrical contact 902. The external electrical contact 902 may be a pin, pad, or other element that is electrically conductive such that external clock may be received. The counter 322 is connected to the external electrical contact 902 in order to receive the external clock. The counter 322 outputs an n bit signal to the comparator 906. The n bit signal repeatedly counts between 0 to $2^n-1$. The parameter storage 334 is read in order to provide a $2^n$ bit code to the comparator 906. The $2^n$ bit code specifies the time slot that has been allocated to the die for high current. As one example, n is 3. Hence, the counter may repeatedly count from 0 to 7. In one embodiment, the counter 322 comprises n flip-flops, with the external clock being used as the clock input of each flip-flop.

As one example, the parameter storage 334 stores an eight bit code. FIG. 10 depicts a table 1000 showing one example of a format for the $2^n$ bit code stored by parameter storage 334. Each of the eight bits in table 1000 corresponds to one of the counts (CNT0, CNT1, etc.) A bit value of "1" indicates that high current usage is allowed for that count. A bit value of "0" indicates that high current usage is not allowed for that count. If all bits are 0 this indicates that TD-PPM is not being performed at the present time. The code can have more than a single 1, in which case high current usage is allowed for more than one count.

Referring again to FIG. 9, the comparator 906 inputs the count from the counter 322 and the code from the parameter storage 334. In an embodiment, the comparator 906 looks for counts that match the counts specified by a "1" in table 1000. For example, if the table 1000 has a "1" at CNT 2 and a "0" for all other counts, then the comparator 906 determines that there is a match whenever the three bit count from the counter 322 is "010". The comparator 906 outputs a peak enable signal that reflects the results. The peak enable signal indicates whether the present count corresponds to a time slot when the die is allowed to have high current usage. The die uses the peak enable signal to determine whether to halt a memory operation in the event that a high current portion is about to occur.

The voltage generator 908 provides an output voltage (e.g., Vdd) to the counter 322 and the comparator 906. The output voltage serves as an operating voltage. In one embodiment, the voltage generator 908 is connected to a Vcc pad in order to receive a supply voltage. In one embodiment, the voltage generator 908 converts Vcc to Vdd, which is the operating voltage for logic such as counter 322 and comparator 906. In some embodiments, the voltage generator 908 keeps operating while the die is in an idle mode such that the counter 322 and comparator 906 can continue to track the external clock. The counter 322 and comparator 906 may be included in what is referred to throughout this description as tracking circuitry. During the idle mode, the die does not perform memory operations. Hence, many, if not most, of the voltage generators on the die may be shut down in the idle mode in order to save current and/or power.

In one embodiment, rather than the voltage generator providing Vdd, a voltage step down circuit is used to step down Vcc received on an external pin in order to produce Vdd. This stepped down voltage is then provided to counter 322 and comparator 906. Since Vcc will be received even while the die is in the idle mode, this alleviates the need to operate the voltage generator 908 in idle mode to provide Vdd to counter 322 and comparator 906.

Figure 11:
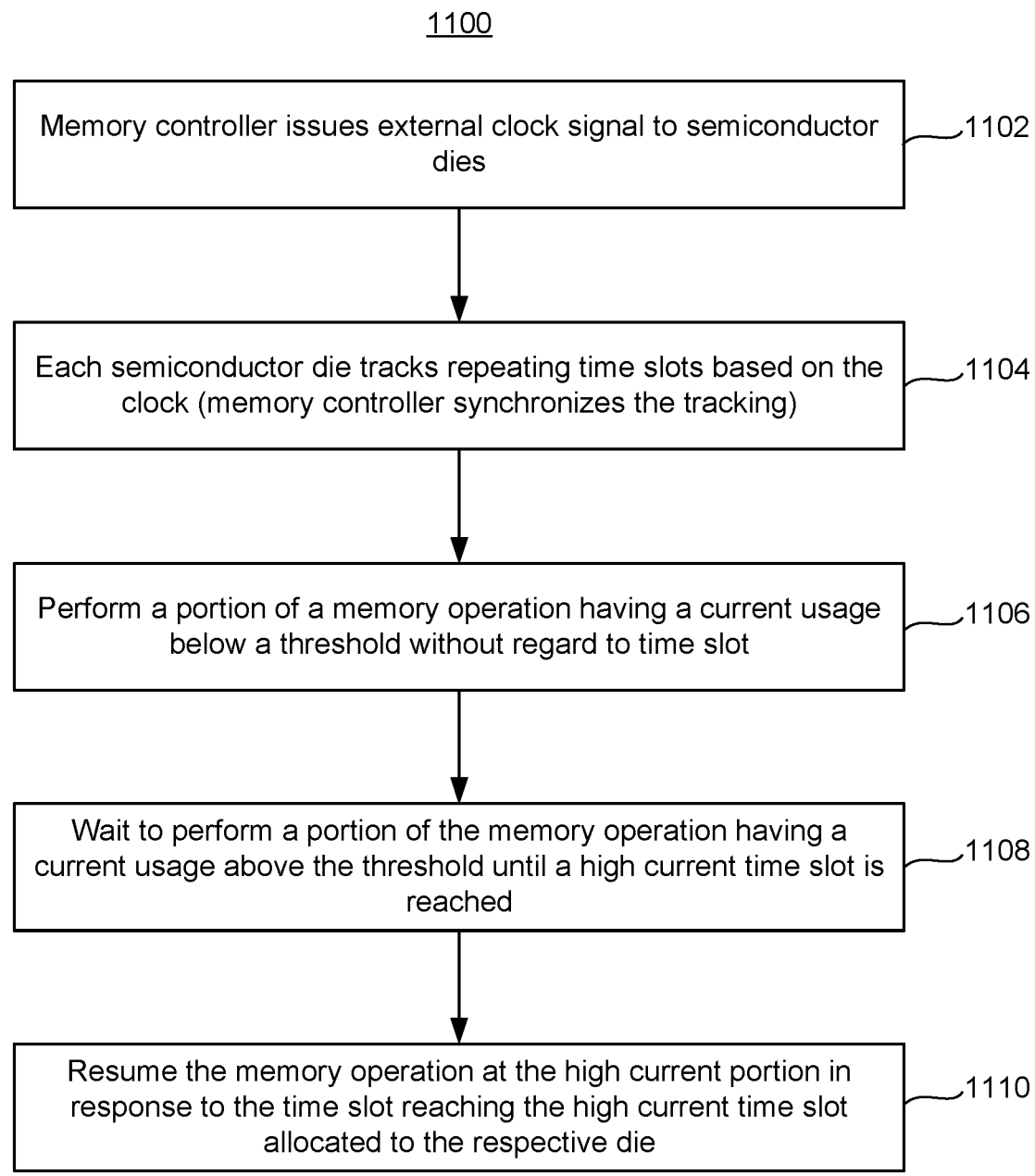
FIG. 11 is a flowchart of one embodiment of a process of controlling current and/or power consumption in non-volatile storage.

FIG. 11 is a flowchart of one embodiment of a process 1100 of controlling current and/or power consumption in non-volatile storage. In one embodiment, process 1100 is performed in memory system 100. The memory system 100 has a memory controller 102 and a set of dies for which current or power is being managed. The set of dies could be those in a memory package 104. In one embodiment, the dies include memory dies 300 having memory cells and control circuitry 310 for performing chip-level control of memory operations. In one embodiment, the dies are in an integrated memory assembly 306 that includes memory structure dies 302 having memory cells and control dies 304 having control circuitry 310 for performing chip-level control of memory operations on the memory cells. The steps are described in process 1100 in certain order as a matter of convenience of explanation. The steps do not necessarily occur in this order.

Step 1102 includes the memory controller 102 issuing an external clock signal to semiconductor dies. The external clock signal may be received at a contact pad 458 at each respective die. The contact pads 458 may be connected together by, for example, wire bonds 406. Note that in some embodiments, the dies are in a stepped configuration such as depicted in FIGS. 4A and 4C. However, in some embodiments, the dies are in not in a stepped configuration, such as depicted in FIG. 4B. In one embodiment, the external clock is provided to each die by way of TSVs 412, 414.

Step 1104 includes each semiconductor die tracking a set of repeating time slots based on the clock. As noted above, a "set of repeating time slots" means that there is some unvarying number of time slots that repeat over and over. The set of time slots could be a sequence, such as from 0 to m−1. In one embodiment, each die repeatedly counts m cycles of the clock signal. The memory controller 102 synchronizes this tracking. Further details of the memory controller 102 synchronizing the tracking are discussed below.

Steps 1106 to 1110 describe functionality at a respective die for a memory operation that is halted in accordance with TD-PPM. Steps 1106 to 1110 may occur many times at each die. The memory operation has a number of portions that use different amount of current. At least one portion has a current usage that is above a threshold, which triggers halting the memory operation unless a high current time slot is occurring.

Step 1106 includes performing a portion of a memory operation having a current usage below a threshold without regard to the time slot. Hence, a die can perform a lower current portion of the operation at any time. With reference to FIG. 6, die 0 performs the portions of the memory operation having current profile 604a without regard to the time slot. In one embodiment, the die performs the lower current portions of the memory operation without regard to the count from counter 322. In one embodiment, the die performs the lower current portions of the memory operation without regard to the state of the peak enable signal.

Referring again to FIG. 11, step 1108 includes waiting to perform a portion of the memory operation having a current usage above the threshold until a high current time slot is reached. In one embodiment, the die waits until the count of the counter 322 hits a count specified in table 1000. In one embodiment, the die waits until the peak enable signal indicates that the high current time slot is reached. With reference to FIG. 6, die 0 waits until the next occurrence of time slot 0 to perform the portion of the memory operation having a current usage above the dashed line labeled "Threshold."

Referring again to FIG. 11, step 1110 includes resuming the memory operation at the high current portion in response to the time slot reaching the high current time slot for the respective die. With reference to FIG. 6, die 0 resumes the memory operation at time slot 0 such that the high current portion is performed during time slot 0.

In some embodiments, the state machine 312 controls memory operations by generating control signals which, in turn, result in voltages being applied within the memory structure 326. In an embodiment, each control signal has two possible values which indicate whether a particular voltage should be set to a certain magnitude or reset to a certain magnitude. In some embodiments, the state machine 312 steps through sub-clocks to perform a memory operation.

Figure 12:
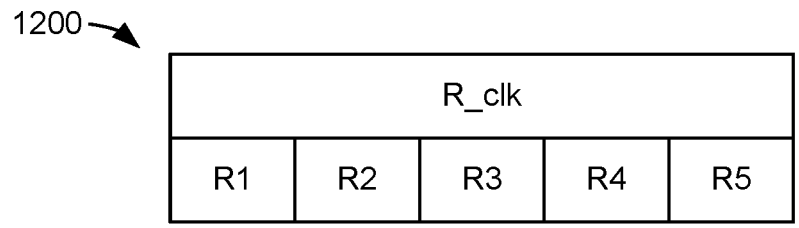
FIG. 12 is a diagram that illustrates one embodiment of sub-clocks during a memory operation.

FIG. 12 is a diagram that illustrates one embodiment of sub-clocks during a memory operation. The memory operation could be, for example, a read of non-volatile memory cells. Table 1200 indicates a clock (R_clk) and some of the sub-clocks (R1, R2, R3, R4, and R5). The state machine 312 proceeds from one sub-clock to the next in order to generate control signals that control application of voltages to the memory structure 326. The sub-clocks each have a predetermined duration, which may be different from one another. The duration may be controlled based on the on-die clock 320. During sub-clocks R1, R2, R3, R4, and R5, the state machine 312 issues set/reset control signals each of which specifies whether a certain voltage should be increased or decreased during that sub-clock. These include voltages that are applied within the memory structure 326. Examples of the voltages include, but are not limited to, word line voltages, select line voltages, and bit line voltages. As another example, a sensing node in a sense amplifier could be charged during a sub-clock. As a result of the voltages, there will be some current used during the sub-clock.

Figure 13:
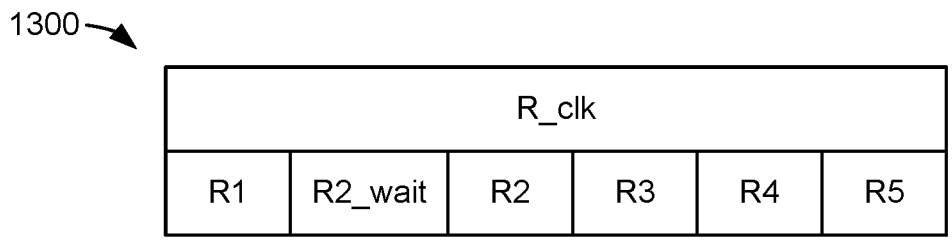
FIG. 13 is a diagram of sub-clocks during a memory operation, in accordance with an embodiment of TD-PPM.

FIG. 13 is a diagram of sub-clocks during a memory operation, in accordance with an embodiment of TD-PPM. This is the same read operation as in the example of FIG. 12. However, table 1300 shows that a wait sub-clock (R2 wait) is inserted immediately prior to sub-clock R2. That is, the R2 wait is immediately between R1 and R3. In this example, current usage during sub-clock R2 is above a threshold and current usage during sub-clock R1 is below the threshold. In an embodiment, in order to proceed from R2 wait to R2, the control circuitry 310 waits until the time slot allocated to the die for high current usage occurs.

Figure 14:
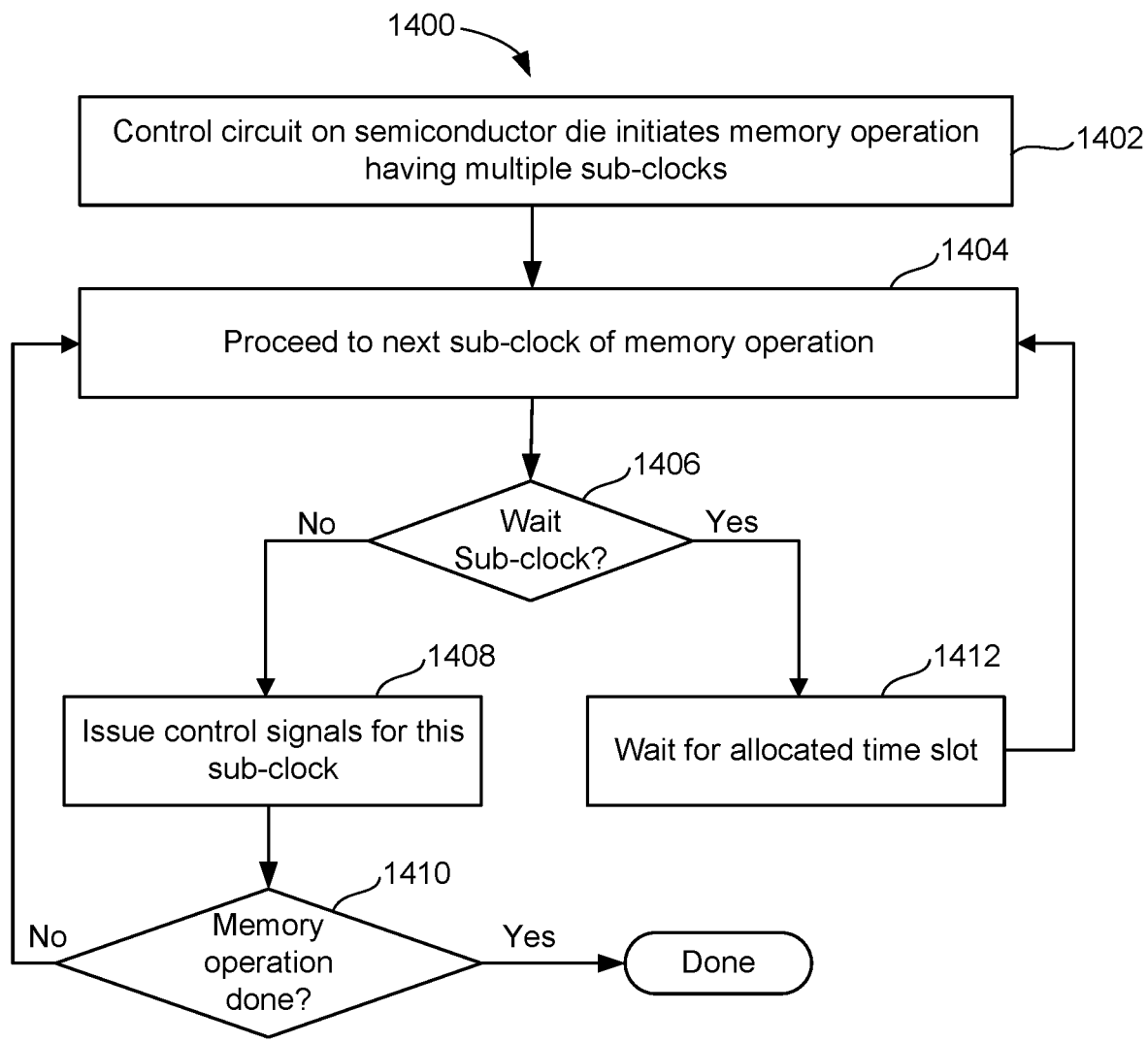
FIG. 14 is a flowchart of one embodiment of a process of halting a memory operation during TD-PPM.

FIG. 14 is a flowchart of one embodiment of a process 1400 of halting a memory operation during TD-PPM. Step 1402 includes a control circuitry 310 on a semiconductor die initiating a memory operation having multiple sub-clocks. Step 1402 includes accessing timing information such as specified by table 1300.

Step 1404 is to proceed to the next sub-clock of the memory operation. For example, with respect to table 1300, the state machine 312 proceeds to sub-clock R1. Step 1406 is a determination of whether this is a wait sub-block. If not, then in step 1408 the control signals associated with the sub-clock are issued by the state machine 312. These control signals may cause one or more voltages that are applied within the memory structure 326 to increase or decrease. Step 1410 is a determination of whether the memory operation is done. For example, the state machine 312 determines whether there are more sub-clocks. If there are more sub-blocks, then control passes to step 1404 to proceed to the next sub-clock. For the sake of example, this is the R2 wait sub-clock. Hence, the state machine 312 will proceed from step 1406 to 1412.

Step 1412 is the execution of the wait sub-clock, which is to wait for the time slot that is allocated to this die for high current usage. In one embodiment, the state machine 312 waits for one of more cycles of on-die clock 320 during step 1412. After waiting until the allocated time slot occurs, control passes back to step 1404. For the sake of example, the next sub-clock is R2, which is a high current sub-clock. Hence, the high current sub-clock will occur during the time slot allocated for high current usage.

In an embodiment, no changes are made to the voltages that are being applied in the memory structure 326 during the wait sub-clock. For example, the state machine 312 need not issue any set/reset control signals. In an embodiment, during the wait sub-clock, the set/reset control signals are held in whatever respective states they had prior to the wait sub-clock. Hence, inserting the wait sub-clock when in TD-PPM mode provides a reliable and uncomplicated way to allow the memory operation to be halted.

Figure 15:
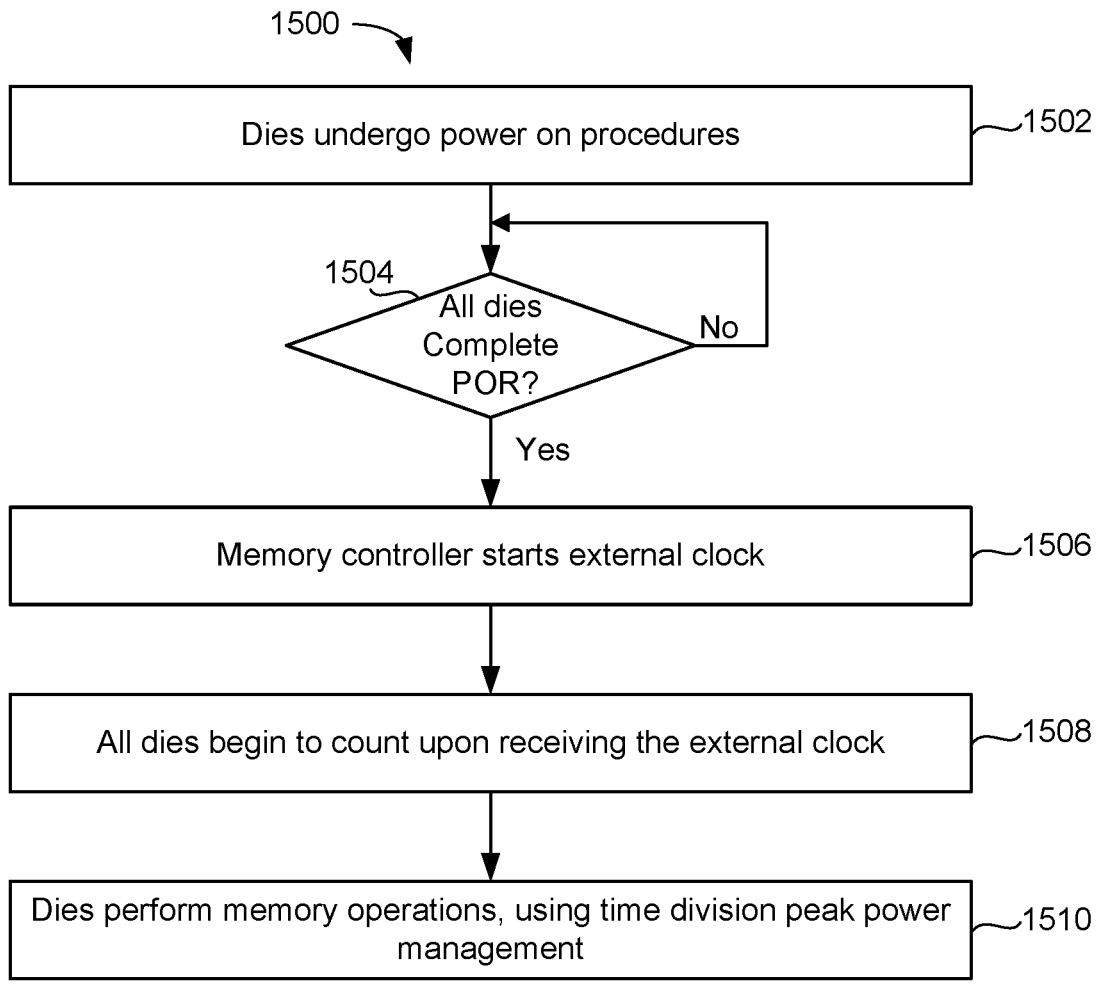
FIG. 15 is a flowchart of one embodiment of a process of synchronizing the tracking of time slots among the dies.

As noted herein, the semiconductor dies of various embodiments will track the set of time slots in a synchronized manner. FIG. 15 is a flowchart of one embodiment of a process 1500 of synchronizing the tracking of time slots among the dies. Step 1502 includes the dies undergoing a power on procedure. This step may be referred to as a power on read (POR). During an embodiment of the POR, TD-PPM is not used. In one embodiment, any memory operations that are performed during POR do not have wait sub-clocks. For example, a read operation might having timing control signals based on table 1200, as opposed to table 1300. The POR may include loading parameters from the structure parameter storage 326a into parameter storage 334. Among those parameters are those that specify what time slot is allocated to the respective die for high current usage. In one embodiment, table 1000 (see FIG. 10) is loaded into parameter storage 334.

Step 1504 is to wait for all dies to complete POR. After all dies have completed POR, the memory controller 102 starts the external clock, in step 1506. Step 1508 includes all dies beginning to count the cycles of the external clock. The dies will have their respective counts synchronized with each other. Hence, the tracking of the set of time slots is synchronized among the dies. Step 1510 includes the dies performing memory operations, using TD-PPM.

Figure 16:
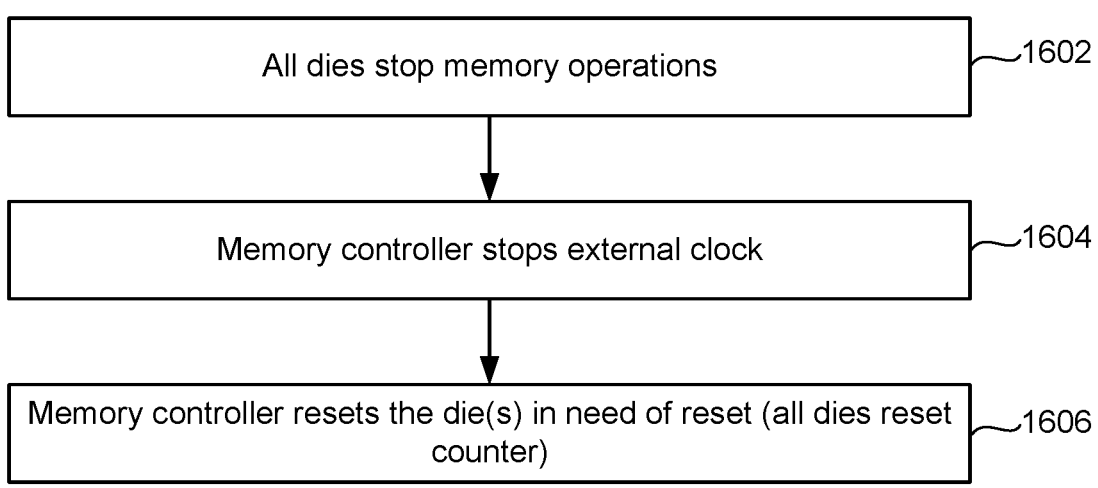
FIG. 16 is a flowchart of one embodiment of a process of maintaining synchronization of tracking the time slots when a die is reset.

From time to time, it may be necessary to reset a die. Resetting a die could potentially result in the synchronization of tracking the time slots being lost. FIG. 16 is a flowchart of one embodiment of a process 1600 of maintaining synchronization of tracking the time slots when a die is reset. Prior to process 1600, a determination is made by, for example, the memory controller 102 that one or more of the dies is to be reset. Prior to process 1600, the dies are tracking the time slots in a synchronized manner.

Step 1602 includes all dies stopping the performance of memory operations. In some embodiments, the memory controller 102 sends a signal to the dies to instruct the dies to not initiate any additional memory operations to those that already are in progress.

Step 1604 includes the memory controller 102 stopping the external clock. In other words, the memory controller 102 stops sending the external clock to the dies. Step 1606 includes the memory controller resetting any dies in need of reset. Resetting a die will result in its counter 322 being reset. Hence, when the counter 322 again begins to count, it will start at 0. In one embodiment, process 1500 is performed to reset the dies. It is not required to reset all of the dies. However, any die that is not reset should at least reset its counter 322.

Figure 17:
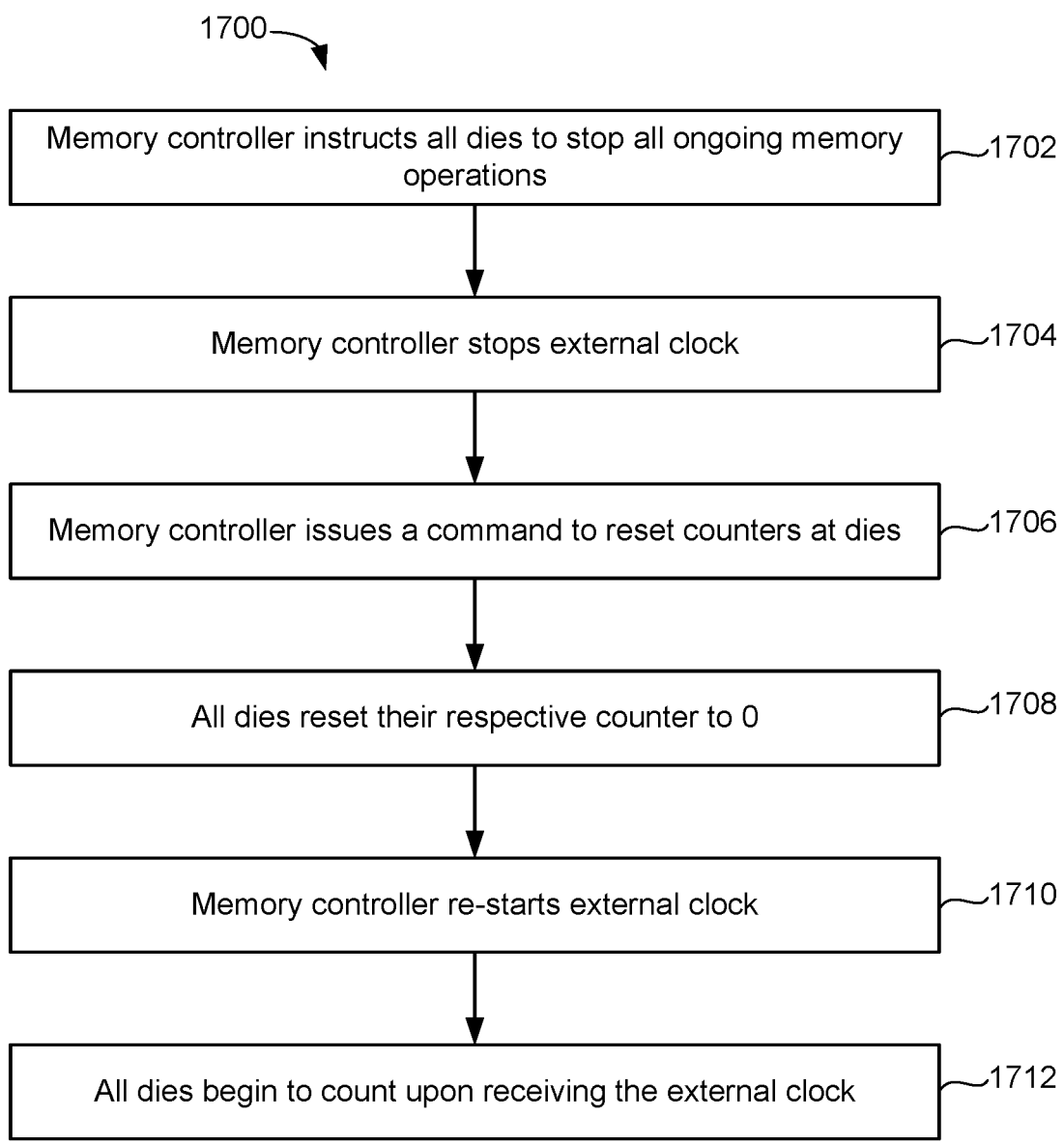
FIG. 17 is a flowchart of one embodiment of a process of re-synchronizing tracking the time slots.

In some cases re-synchronizing the dies may be achieved without resetting any of the dies. Hence, a process such as process 1500 in FIG. 15 can be avoided. FIG. 17 is a flowchart of one embodiment of a process 1700 of re-synchronizing the counting. This process 1700 may be performed when it has been determined that the counting is no longer synchronized. Step 1702 includes the memory controller 102 instructing all dies to stop ongoing memory operations. Step 1704 includes the memory controller 102 stopping the external clock. Step 1706 includes the memory controller 102 issuing a command to the dies to reset their respective counters 322. Step 1708 includes all dies resetting their counters 322 to zero. The dies also stop any counting, as the external clock is not present at this time. Step 1710 includes the memory controller 102 re-starting the external clock. Step 1712 includes all dies beginning to count clock cycles again, in response to receiving the external clock. Thus, all dies start to count at 0. Therefore, the counting of the cycles of the external clock is once again synchronized. Therefore, the tracking of the time slots is also synchronized.

When a die is not actively performing a memory operation it may shut down some of its circuitry in order to save current and/or power. However, in an embodiment, even if a die is not actively performing a memory operation the die will still track the time slots in order to keep the tracking synchronized. To be able to keep tracking the time slots, the die may continue to operate circuitry such as counter 322 and comparator 906. Moreover, a voltage generator 908 that provides an operating voltage (e.g., Vdd) to such circuitry may also be kept running. However, many of the voltage generators on the die can be shut down to save current and/or power.

Figure 18:
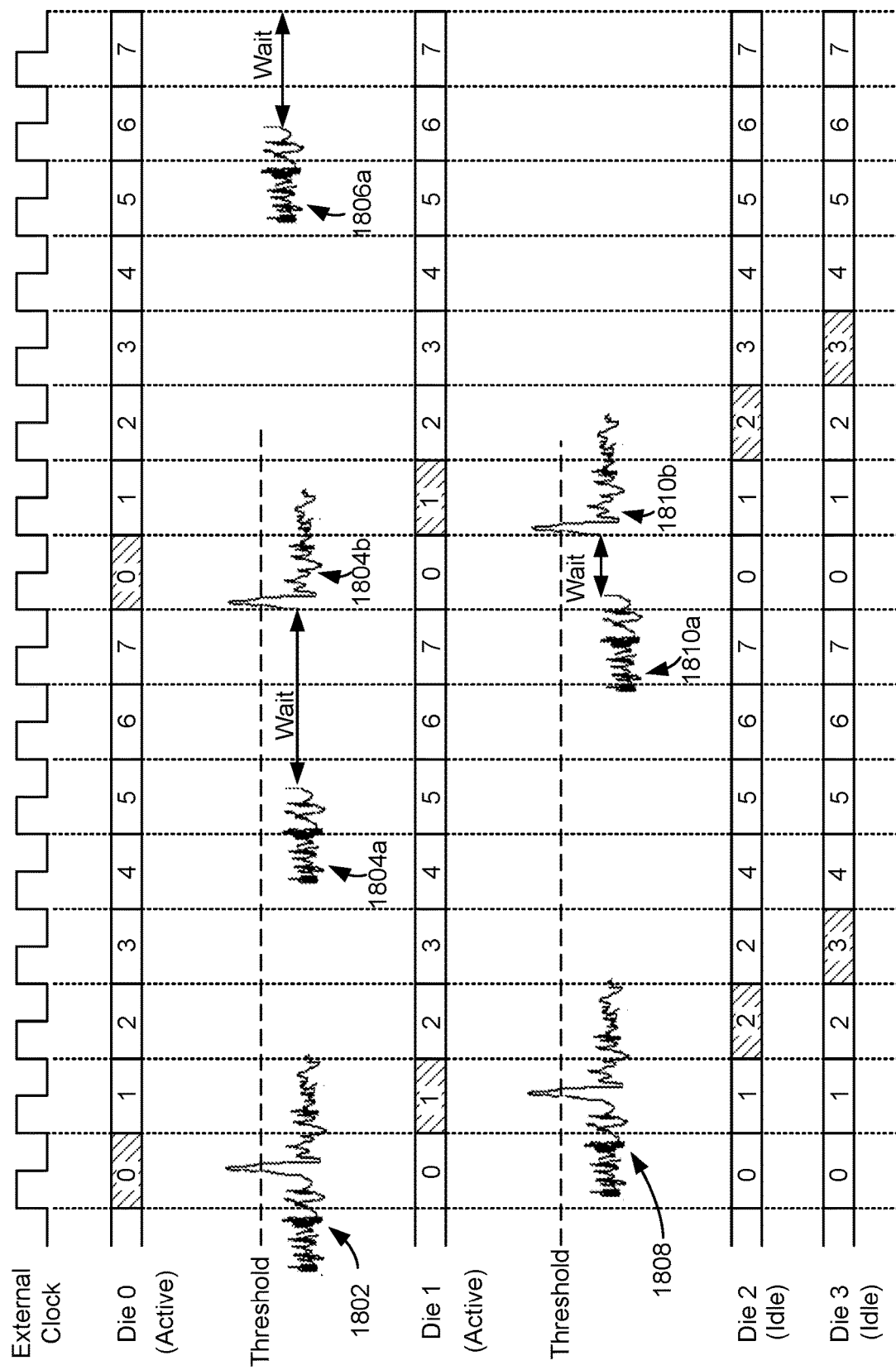
FIG. 18 is a diagram illustrating one embodiment of TD-PPM in which some dies are active and some are idle.

FIG. 18 is a diagram illustrating one embodiment of TD-PPM in which some dies are active and some are idle. The external clock is provided by the memory controller 102 to each die. Two die (Die 0, Die 1) are active as indicated by the current profiles 1802, 1804a, 1804b, 1806a, 1808, 1810a, and 1810b. Two dies (Die 2, Die 3) are idle, as indicated by the lack of current profiles. Each die is counting the clock cycles, which are cycle 0 to cycle 7 in this example.

Die 0 has been allocated time slot 0 to perform a high peak current portion of a memory operation, as represented by the cross-hatching. Die 1 has been allocated time slot 1 to perform a high peak current portion of a memory operation, as represented by the cross-hatching. Die 2 has been allocated time slot 2 to perform a high peak current portion of a memory operation, as represented by the cross-hatching. Die 3 has been allocated time slot 3 to perform a high peak current portion of a memory operation, as represented by the cross-hatching.

Figure 19:
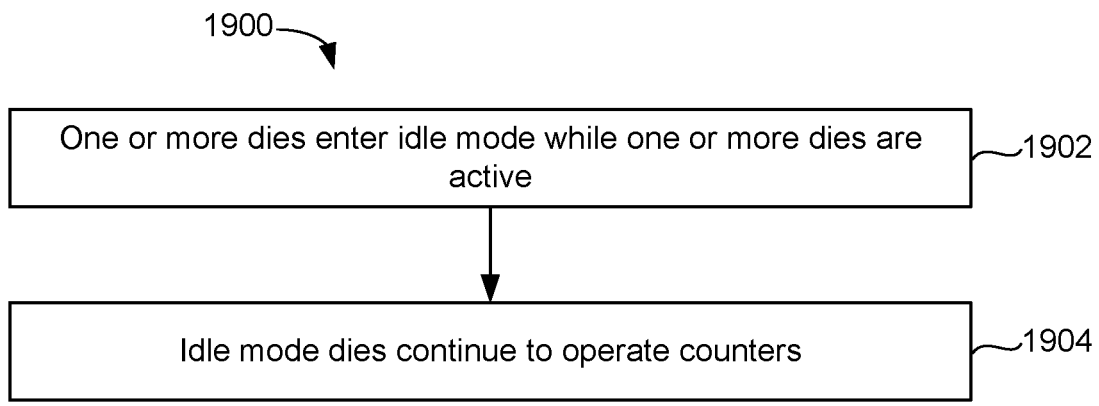
FIG. 19 is a flowchart of one embodiment of a process of operating counters in idle mode.

FIG. 19 is a flowchart of one embodiment of a process 1900 of operating counters 322 in idle mode. Prior to process 1900 all of the dies are in an active mode in which memory operations are being performed. Also, the dies are synchronously tracking the time slots by counting the cycles of the external clock. Step 1902 includes one or more dies entering an idle mode while one or more of the dies remain in the active mode. Memory operations are not performed in the idle mode. Memory operations on the non-volatile memory cells are performed in the idle mode. Step 1904 includes the idle mode dies continuing to operate their respective counters 322. Active mode dies also operate their respective counters 322. Hence, synchronous tracking of the time slots is maintained.

Figure 20:
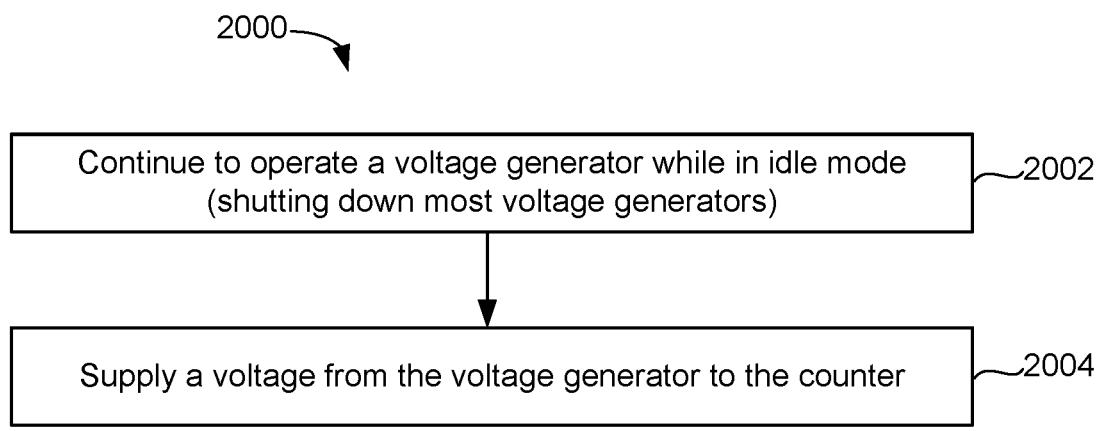
FIG. 20 is a flowchart depicting further details of one embodiment of a process of operating counters in idle mode.

FIG. 20 is a flowchart depicting further details of one embodiment of a process 2000 of operating counters 322 in idle mode. Process 2000 describes actions of one die that is in the idle mode. Step 2002 includes the idle mode die continuing to operate a voltage generator 908 while in the idle mode. However, many, if not most, of the voltage generators on the die are shut down. For example, voltage generators that supply voltages to a sense amplifier may be shut down. Step 2004 includes supplying a voltage from the voltage generator 908 to the counter 322, such that the counter 322 is able to continue to count the cycles of the external clock. Step 2004 may also include supplying a voltage from the voltage generator 908 to the comparator 906, such that the comparator 906 is able to continue to produce the peak enable signal. Hence, synchronous tracking of the time slots is maintained even if a die is in idle mode.

Other techniques can be used to maintain synchronous tracking of the time slots even if a die is in idle mode. In one embodiment, the idle die receives a supply voltage (e.g., Vcc) on one of its external pins whether it is the active mode or the idle mode. This voltage might not be suitable for internal logic such as the counter 322 or the comparator 906. Hence, the die may level shift the supply voltage to a magnitude that is suitable for the internal logic such that counting of the external clock can continue in the idle mode.

In the event that TD-PPM is not presently being used to control power usage of a set of dies, it is not required that the counters 322 for the respective dies be active. In some embodiments, a die enters a standby mode when memory operations are not being performed and TD-PPM is not presently being used. In the standby mode, the counter 322 and comparator 906 need not be operated. Moreover, the aforementioned voltage generator 908 that was kept on in the idle mode can be turned off. Hence, the standby mode consumes less current and/or power than an embodiment of the idle mode in which the cycles of the external clock are counted.

FIG. 21 is a diagram illustrating one embodiment in which the memory controller 102 controls the modes, and places dies in standby mode. The memory controller 102 uses a chip enable (CEnx) signal to control the modes in this embodiment. Note that CEnx is common to all dies. When CEnx is active (i.e. low) the dies are in either the active mode or the idle mode, depending on whether the die is performing a memory operation. The current profiles 2102, 2104, and 2106 show that die 0 and die 1 are active for at least some portion of the time depicted in FIG. 21. However, die 2 and die 3 are idle the whole time that CEnx is active.

When CEnx is low, the dies operate circuitry that tracks the external clock, as long as the external clock is present. For example, counter 322 and comparator 906 are operated. Also, voltage generator 908 may provide an operating voltage to the counter 322 and comparator 906.

When CEnx is high all dies go into the standby mode. During the standby mode, none of the dies operate the circuitry for tracking the count of the external clock. For example, counter 322 and comparator 906 are disabled or shut down. Also, voltage generator 908 may be disabled or shut down. Therefore, less current and/or power is used during the standby mode.

FIG. 22 is a flowchart of one embodiment of a process 2200 of the memory controller 102 controlling modes during TD-PPM. Process 2200 will be discussed with reference to FIG. 21. The process 2200 begins at step 2202 with a decision of whether there is any die having an active memory operation. If at least one die has an active memory operation, then steps 2204 to 2208 are performed. Step 2204 includes the memory controller 102 issuing a signal to place all dies into an active/idle mode. With reference to FIG. 21, the memory controller 102 holds CEnx low to place all dies into the active/idle mode. With reference again to FIG. 22, step 2206 include the dies having active memory operations performing the memory operations, as well as counting the clock cycles. Step 2206 include the dies not having an active memory operation counting the clock cycles.

Returning again to the discussion of step 2202, if none of the dies has an active memory operation, then steps 2210 and 2212 are performed. Step 2210 includes the memory controller 102 stopping the external clock. Step 2212 includes the memory controller 102 issuing a signal to place all dies into a standby mode. With reference to FIG. 21, the memory controller 102 holds CEnx high to place all dies into the standby mode. As mentioned above, less current and/or power is used current the standby mode than the idle mode.

There are other ways in which dies can be placed into the standby mode. FIG. 23 is a diagram illustrating another embodiment in which the modes can be controlled such that dies can be placed into the standby mode. The memory controller 102 issues a CEnx signal, which is common to all dies. In this embodiment, the memory controller 102 holds CEnx low when a command, an address, or data is provided. However, after the memory controller 102 has provided this information to the dies, the memory controller 102 may raise CEnx to high. In this embodiment, the default mode when CEnx is high is the active/idle mode. Note that this is contrary to the example in FIG. 21, in which when CEnx is high the dies go to standby. Similar to the example in FIG. 21, die 0 and die 1 have current profiles 2302, 2304, and 2306 indicating active memory operations. However, die 2 and die 3 do not have any active memory operations. Also, all dies count the external clock cycles when in the active/idle mode.

To go into a standby mode, the memory controller 102 issues a deep standby command (CMD) to the dies. The dies respond to the deep standby command by going to the standby mode. The memory controller issues a deep standby exit command to cause the dies to leave the standby mode, and return to the active/idle mode. When the external clock is re-started, the dies with start the clock count. Note that when issuing these two commands CEnx is low, consistent with the explanation above that CEnx is low when a command is sent by the memory controller 102. In one embodiment, the deep standby command and the deep standby exit command are vender specific commands in a memory interface specification. For example, ONFI permits vender specific commands. Hence, the deep standby command and the deep standby exit command may be vender specific commands in accordance with ONFI.

One variation of the technique depicted in FIG. 23 is for the memory controller 102 to not issue the deep standby command (or the deep standby exit command). Hence, in this variation, the standby mode is not used, which simplifies operation. However, placing the dies into the standby mode can save current and/or power, as discussed already.

In view of the above, it can be seen that a first embodiment includes an apparatus comprising one or more semiconductor dies. Each respective semiconductor die having a control circuit configured to connect to a plurality of non-volatile memory cells. The control circuit of each respective semiconductor die is configured to receive an external clock signal from a memory controller external to the semiconductor die. The control circuit of each respective semiconductor die is configured to track a repeating set of time slots based on the external clock signal, wherein each respective semiconductor die is allocated one or more of the time slots in the repeating set for current usage above a threshold. The control circuit of each respective semiconductor die is configured to initiate a memory operation on a group of the memory cells, wherein the memory operation includes a plurality of portions including a high current portion that has current usage above the threshold. The control circuit of each respective semiconductor die is configured to halt the memory operation if the high current portion would otherwise occur in a time slot that is not allocated for current usage above the threshold for the respective semiconductor die. The control circuit of each respective semiconductor die is configured to resume the halted memory operation such that the high current portion occurs during a next available time slot that is allocated to the respective semiconductor die for current usage above the threshold.

In a second embodiment, and in furtherance of the first embodiment, the one or more semiconductor dies comprise a plurality of semiconductor dies.

In a third embodiment, and in furtherance of the second embodiment, the apparatus further comprises the memory controller. The memory controller is configured to synchronize the plurality of semiconductor dies to track the repeating set of time slots.

In a fourth embodiment, and in furtherance of the second or third embodiments, each respective semiconductor die comprises tracking circuitry configured to track the repeating set of time slots. Each respective semiconductor die is configured to continue to operate the tracking circuitry when in an idle mode in which the respective semiconductor die is not performing a memory operation on the non-volatile memory cells.

In a fifth embodiment, and in furtherance of any of the second to fourth embodiments, the apparatus further comprises further comprising the memory controller. The memory controller is configured to issue a control signal to the plurality of semiconductor dies to place each semiconductor die into a standby mode when none of the plurality of semiconductor dies are performing a memory operation. The standby mode consumes less current than the idle mode.

In a sixth embodiment, and in furtherance of any of the first to fifth embodiments, the control circuit of each respective semiconductor die is further configured to perform the memory operation by proceeding through a plurality of sub-clocks, wherein the plurality of sub-clocks include a high current sub-clock in which current usage is more than the threshold and a wait sub-clock that immediately proceeds the high current sub-clock. The control circuit of each respective semiconductor die is further configured to halt the memory operation by waiting during the wait sub-clock if the present time slot is not the one or more of the time slots allocated to the semiconductor die for current usage above the threshold; and resume the memory operation by proceeding from the wait sub-clock to the high current sub-clock when the next available time slot that is allocated for current usage above the threshold begins.

In a seventh embodiment, and in furtherance of the sixth embodiment, the control circuit of each respective semiconductor die is further configured to include the wait sub-clock immediately between the high current sub-clock and a lower current sub-clock in memory operations when in a peak current limitation mode, wherein the lower current sub-clock has current usage below the threshold; and perform the memory operation by proceeding directly from the lower current sub-clock to the high current sub-clock when not in the peak current limitation mode.

In an eighth embodiment, and in furtherance of any of the first to seventh embodiments, each respective semiconductor die further comprises an external electrical contact. The control circuit is further configured to receive the external clock signal on the external electrical contact when in a peak current limitation mode; and operate a test mode using a test clock received on the external electrical contact when in the test mode.

In a ninth embodiment, and in furtherance of any of the first to seventh embodiments, each respective semiconductor die further comprises an external electrical contact. The control circuit is further configured to receive the external clock signal on the external electrical contact when in a peak current limitation mode; and place the semiconductor die into a write protect mode in response to receiving a write protect signal on the external electrical contact at a time when not in the peak current limitation mode.

In a tenth embodiment, and in furtherance of any of the first to seventh embodiments, each respective semiconductor die further comprises a ZQ calibration pin. The control circuit is further configured to receive the external clock signal on the ZQ calibration pin when in a peak current limitation mode.

In an eleventh embodiment, and in furtherance of any of the first to seventh embodiments, each respective semiconductor die further comprises a ready/busy pin and a ready/busy register. The control circuit is further configured to receive the external clock signal on the ready/busy pin when in a peak current limitation mode; and store ready/busy status into the ready/busy register.

One embodiment includes a method of operating non-volatile storage. The method comprises issuing an external clock signal from a memory controller to each of a plurality of semiconductor dies, wherein each semiconductor die comprises a control circuit configured to connect to a plurality of non-volatile memory cells. The method comprises counting m cycles of the external clock signal with a counter at each respective semiconductor die, including the memory controller synchronizing the counting such that the semiconductor dies repeatedly cycle through the m counts in a synchronized manner. The method comprises performing, by each respective semiconductor die, portions of memory operations having a peak current usage lower than a threshold regardless of the clock cycle count. The method comprises waiting, by each respective semiconductor die, to perform portions of the memory operations having a peak current usage higher than the threshold until the clock cycle count reaches a count assigned to the respective semiconductor die for high current usage. The method comprises resuming, by each respective semiconductor die, the portions of the memory operations having a peak current usage higher than the threshold in response to the clock cycle count reaching the count assigned to the respective semiconductor die for high current usage.

One embodiment includes a non-volatile storage system, comprising a memory controller and a plurality of semiconductor dies in communication with the memory controller. Each semiconductor die comprise a control circuit configured to connect to a memory structure having a plurality of non-volatile memory cells. Each semiconductor die comprises an external electrical contact. Each semiconductor die comprises a counter. The memory controller provides an external clock signal to the external electrical contact of each respective semiconductor die. The control circuit of each respective semiconductor die accesses an indication of a time slot in which the respective semiconductor die is allowed to perform a high power portion of a memory operation having a plurality of portions with different power usages, wherein different semiconductor dies are allocated different time slots to spread out power usage, wherein the high power portion has a power usage above a threshold. The control circuit of each respective semiconductor die tracks a repeating set of time slots based on the external clock signal, wherein the memory controller is configured to synchronize the tracking of the repeating set of time slots between the semiconductor dies. The control circuit of each respective semiconductor die performs a portion of a memory operation on a group of the memory cells, including apply voltages to the memory structure to which the respective semiconductor die is connected. The control circuit of each respective semiconductor die holds the voltages applied to the memory structure at present values to avoid performing the high power portion outside of the allocated time slot. The control circuit of each respective semiconductor die changes the voltages applied to the memory structure to perform the high power portion of the memory operation when the time slot reaches the allocated time slot.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   one or more semiconductor dies, each respective semiconductor die having a control circuit configured to connect to a respective plurality of non-volatile memory cells, wherein the control circuit of each respective semiconductor die is configured to:
   receive an external clock signal from a memory controller external to the semiconductor die;
   track a repeating set of time slots based on the external clock signal, wherein each respective semiconductor die is allocated one or more of the time slots in the repeating set for current usage above a threshold;
   initiate a memory operation on a group of the memory cells, wherein the memory operation includes a plurality of portions including a high current portion that has current usage above the threshold;
   halt the memory operation if the high current portion would otherwise occur in a time slot that is not allocated for current usage above the threshold for the respective semiconductor die; and
   resume the halted memory operation such that the high current portion occurs during a next available time slot that is allocated to the respective semiconductor die for current usage above the threshold.

2. The apparatus of claim 1, wherein the one or more semiconductor dies comprise a plurality of semiconductor dies.

3. The apparatus of claim 2, further comprising the memory controller, wherein the memory controller is configured to:
   synchronize the plurality of semiconductor dies to track the repeating set of time slots.

4. The apparatus of claim 2, wherein:
   each respective semiconductor die comprises tracking circuitry configured to track the repeating set of time slots; and
   each respective semiconductor die is configured to continue to operate the tracking circuitry when in an idle mode in which the respective semiconductor die is not performing a memory operation on the non-volatile memory cells.

5. The apparatus of claim 4, further comprising the memory controller, wherein the memory controller is configured to:
   issue a control signal to the plurality of semiconductor dies to place each semiconductor die into a standby mode when none of the plurality of semiconductor dies are performing a memory operation, wherein the standby mode consumes less current than the idle mode.

6. The apparatus of claim 1, wherein the control circuit of each respective semiconductor die is further configured to:
   perform the memory operation by proceeding through a plurality of sub-clocks, wherein the plurality of sub-clocks include a high current sub-clock in which current usage is more than the threshold and a wait sub-clock that immediately proceeds the high current sub-clock;
   halt the memory operation by waiting during the wait sub-clock if the present time slot is not the one or more of the time slots allocated to the semiconductor die for current usage above the threshold; and
   resume the memory operation by proceeding from the wait sub-clock to the high current sub-clock when the next available time slot that is allocated for current usage above the threshold begins.

7. The apparatus of claim 6, wherein the control circuit of each respective semiconductor die is further configured to:
   include the wait sub-clock immediately between the high current sub-clock and a lower current sub-clock in memory operations when in a peak current limitation mode, wherein the lower current sub-clock has current usage below the threshold; and
   perform the memory operation by proceeding directly from the lower current sub-clock to the high current sub-clock when not in the peak current limitation mode.

8. The apparatus of claim 1, wherein each respective semiconductor die further comprises an external electrical contact, wherein the control circuit is further configured to:
   receive the external clock signal on the external electrical contact when in a peak current limitation mode; and operate a test mode using a test clock received on the external electrical contact when in the test mode.

9. The apparatus of claim 1, wherein each respective semiconductor die further comprises an external electrical contact, wherein the control circuit is further configured to:
receive the external clock signal on the external electrical contact when in a peak current limitation mode; and
place the semiconductor die into a write protect mode in response to receiving a write protect signal on the external electrical contact at a time when not in the peak current limitation mode.

10. The apparatus of claim 1, wherein each respective semiconductor die further comprises a ZQ calibration pin, wherein the control circuit is further configured to:
receive the external clock signal on the ZQ calibration pin when in a peak current limitation mode.

11. The apparatus of claim 1, wherein each respective semiconductor die further comprises a ready/busy pin and a ready/busy register, wherein the control circuit is further configured to:
receive the external clock signal on the ready/busy pin when in a peak current limitation mode; and
store ready/busy status into the ready/busy register.

12. A method of operating non-volatile storage, the method comprising:
issuing an external clock signal from a memory controller to each of a plurality of semiconductor dies, wherein each semiconductor die comprises a control circuit configured to connect to a plurality of non-volatile memory cells;
counting m cycles of the external clock signal with a counter at each respective semiconductor die, including the memory controller synchronizing the counting such that the semiconductor dies repeatedly cycle through the m counts in a synchronized manner;
performing, by each respective semiconductor die, portions of memory operations having a peak current usage lower than a threshold regardless of the clock cycle count;
waiting, by each respective semiconductor die, to perform portions of the memory operations having a peak current usage higher than the threshold until the clock cycle count reaches a count assigned to the respective semiconductor die for high current usage; and
resuming, by each respective semiconductor die, the portions of the memory operations having a peak current usage higher than the threshold in response to the clock cycle count reaching the count assigned to the respective semiconductor die for high current usage.

13. The method of claim 12, further comprising:
entering an idle mode, by a first semiconductor die of the plurality of semiconductor dies, in which memory operations on the non-volatile memory cells are not performed by the first semiconductor die; and
continuing to count the cycles of the external clock signal with the counter at the first semiconductor die throughout the idle mode.

14. The method of claim 13, further comprising:
issuing a control signal from the memory controller to each of the plurality of semiconductor dies at a time when none of the plurality of semiconductor dies are performing a memory operation; and
entering in response to receiving the control signal, by each semiconductor die, a standby mode in which the counters are disabled, wherein the standby mode consumes less peak current than the idle mode.

15. A non-volatile storage system, comprising:
a memory controller; and
a plurality of semiconductor dies in communication with the memory controller, each semiconductor die comprising a control circuit configured to connect to a memory structure having a plurality of non-volatile memory cells, each semiconductor die comprising an external electrical contact, each semiconductor die comprising a counter;
wherein the memory controller:
provides an external clock signal to the external electrical contact of each respective semiconductor die;
wherein the control circuit of each respective semiconductor die:
accesses an indication of a time slot in which the respective semiconductor die is allowed to perform a high power portion of a memory operation having a plurality of portions with different power usages, wherein different semiconductor dies are allocated different time slots to spread out power usage, wherein the high power portion has a power usage above a threshold;
tracks a repeating set of time slots based on the external clock signal, wherein the memory controller is configured to synchronize the tracking of the repeating set of time slots between the semiconductor dies;
performs a portion of a memory operation on a group of the memory cells, including apply voltages to the memory structure to which the respective semiconductor die is connected;
holds the voltages applied to the memory structure at present values to avoid performing the high power portion outside of the allocated time slot; and
changes the voltages applied to the memory structure to perform the high power portion of the memory operation when the time slot reaches the allocated time slot.

16. The non-volatile storage system of claim 15, wherein the control circuit of each respective semiconductor die:
continues to track the repeating set of time slots when in an idle mode in which memory operations are not performed by the respective semiconductor die.

17. The non-volatile storage system of claim 15, wherein the control circuit of each respective semiconductor die:
holds the voltages applied to the memory structure at present values to avoid performing the high power portion outside of the allocated time slot by waiting during a wait sub-clock that proceeds a high power sub-clock; and
changes the voltages applied to the memory structure to perform the high power portion of the memory operation when the time slot reaches the allocated time slot by proceeding from the wait sub-clock to the high power sub-clock when the next available time slot that is allocated for high power usage begins.

18. The non-volatile storage system of claim 15, wherein:
the memory controller further:
stops the external clock in response to the semiconductor dies losing synchronization of the tracking of the repeating set of time slots; and
issues a counter reset signal to each semiconductor die to reset the counter of each respective semiconductor die; and
re-starts the external clock after issuing the counter reset signal;
each respective semiconductor die is further configured to:

resets the counter of the respective semiconductor die in response to receiving the reset signal; and re-starts the counter in response to the external clock re-starting.

19. The non-volatile storage system of claim 15, wherein each respective semiconductor die comprises the plurality of non-volatile memory cells.

20. The non-volatile storage system of claim 15, further comprising a plurality of memory structure dies, each memory structure die comprising a plurality of non-volatile memory cells, wherein each respective semiconductor die controls memory operations for at least one of the memory structure dies.

* * * * *